US010529518B2

(12) United States Patent
Fitzgerald et al.

(10) Patent No.: US 10,529,518 B2
(45) Date of Patent: Jan. 7, 2020

(54) PROTECTION SCHEMES FOR MEMS SWITCH DEVICES

(71) Applicant: Analog Devices Global, Hamilton (BM)

(72) Inventors: Padraig Liam Fitzgerald, Mallow (IE); Srivatsan Parthasarathy, Acton, MA (US); Javier A. Salcedo, North Billerica, MA (US)

(73) Assignee: Analog Devices Global, Hamilton (BM)

( * ) Notice: Subject to any disclaimer, the term of this patent is extended or adjusted under 35 U.S.C. 154(b) by 439 days.

(21) Appl. No.: 15/269,086

(22) Filed: Sep. 19, 2016

(65) Prior Publication Data

US 2018/0083439 A1 Mar. 22, 2018

(51) Int. Cl.
*H02H 9/00* (2006.01)
*H01H 59/00* (2006.01)
(Continued)

(52) U.S. Cl.
CPC ....... *H01H 59/0009* (2013.01); *B81C 1/0023* (2013.01); *B81C 1/00246* (2013.01);
(Continued)

(58) Field of Classification Search
CPC ................................ H02H 9/04; H02H 9/005
(Continued)

(56) References Cited

U.S. PATENT DOCUMENTS 6,531,331 B1 3/2003 Bennett et al.
6,930,569 B2 * 8/2005 Hsu ..................... H03H 3/0072
310/348

(Continued)

FOREIGN PATENT DOCUMENTS

DE 102015110467 A1 1/2016
EP 2264763 A1 12/2010
EP 2729951 B1 12/2015

OTHER PUBLICATIONS

Sangameswaran, Sandeep, et al., "A SCR-based ESD protection for MEMS—Merits and Challenges", *EOS/ESD Symposium Proceedings*, Sep. 11-16, 2011, (2011), 10 pgs.
(Continued)

*Primary Examiner* — Thienvu V Tran
*Assistant Examiner* — Lucy M Thomas
(74) *Attorney, Agent, or Firm* — Schwegman Lundberg & Woessner, P.A.

(57) ABSTRACT

Micro-electromechanical switch (MEMS) devices can be fabricated using integrated circuit fabrication techniques and materials. Such switch devices can provide cycle life and insertion loss performance suiting for use in a broad range of applications including, for example, automated test equipment (ATE), switching for measurement instrumentation (such as a spectrum analyzer, network analyzer, or communication test system), and uses in communication systems, such as for signal processing. MEMS devices can be vulnerable to electrical over-stress, such as associated with electrostatic discharge (ESD) transient events. A solid-state clamp circuit can be incorporated in a MEMS device package to protect one or more MEMS devices from damaging overvoltage conditions. The clamp circuit can include single or multiple blocking junction structures having complementary current-voltage relationships, such as to help linearize a capacitance-to-voltage relationship presented by the clamp circuit.

44 Claims, 17 Drawing Sheets

(51) Int. Cl.
*H01L 27/02* (2006.01)
*H01L 23/31* (2006.01)
*H02H 9/04* (2006.01)
*B81C 1/00* (2006.01)
*H01L 27/12* (2006.01)
*H01L 23/495* (2006.01)

(52) U.S. Cl.
CPC ...... *H01L 23/3107* (2013.01); *H01L 27/0255* (2013.01); *H01L 27/0262* (2013.01); *H02H 9/041* (2013.01); *H02H 9/046* (2013.01); *B81C 2203/0735* (2013.01); *H01L 23/49541* (2013.01); *H01L 27/1203* (2013.01); *H01L 2224/48091* (2013.01); *H01L 2224/48137* (2013.01); *H01L 2224/48145* (2013.01); *H01L 2224/48227* (2013.01); *H01L 2224/48247* (2013.01); *H01L 2924/16235* (2013.01); *H01L 2924/181* (2013.01); *H01L 2924/19105* (2013.01)

(58) Field of Classification Search
USPC .......................................................... 361/56
See application file for complete search history.

(56) References Cited

U.S. PATENT DOCUMENTS

| | | | |
|---|---|---|---|
| 7,405,861 B2 * | 7/2008 | Floyd | B81B 7/0012 359/196.1 |
| 7,529,017 B1 * | 5/2009 | Walker | B81C 1/00976 359/290 |
| 8,154,365 B2 | 4/2012 | Chan et al. | |
| 8,193,595 B2 | 6/2012 | Mohanakrishnaswamy et al. | |
| 8,212,320 B1 * | 7/2012 | Vashchenko | H01L 27/0259 257/110 |
| 8,330,224 B2 | 12/2012 | Kwa | |
| 8,334,729 B1 | 12/2012 | Khlat | |
| 8,638,093 B2 | 1/2014 | Aimi et al. | |
| 8,748,205 B1 | 6/2014 | Liang et al. | |
| 2005/0170656 A1 | 8/2005 | Nasiri et al. | |
| 2007/0009202 A1 | 1/2007 | Chan et al. | |
| 2007/0181411 A1 | 9/2007 | Ikehashi et al. | |
| 2009/0161277 A1 | 6/2009 | Roesner et al. | |
| 2010/0126834 A1 * | 5/2010 | Ikehashi | G11C 23/00 200/181 |
| 2011/0199147 A1 | 8/2011 | Ikehashi | |
| 2014/0002180 A1 * | 1/2014 | Daghighian | H02M 3/156 327/540 |
| 2014/0145244 A1 * | 5/2014 | Daneman | B81C 3/001 257/254 |
| 2014/0160607 A1 | 6/2014 | Reimann et al. | |
| 2015/0035387 A1 | 2/2015 | Macnamara et al. | |
| 2015/0076490 A1 * | 3/2015 | Koga | H01C 7/112 257/43 |

OTHER PUBLICATIONS

"German Application Serial No. 10 2017 121 611.1, Office Action dated Jan. 16, 2018", w/English Translation, 9 pgs.

* cited by examiner

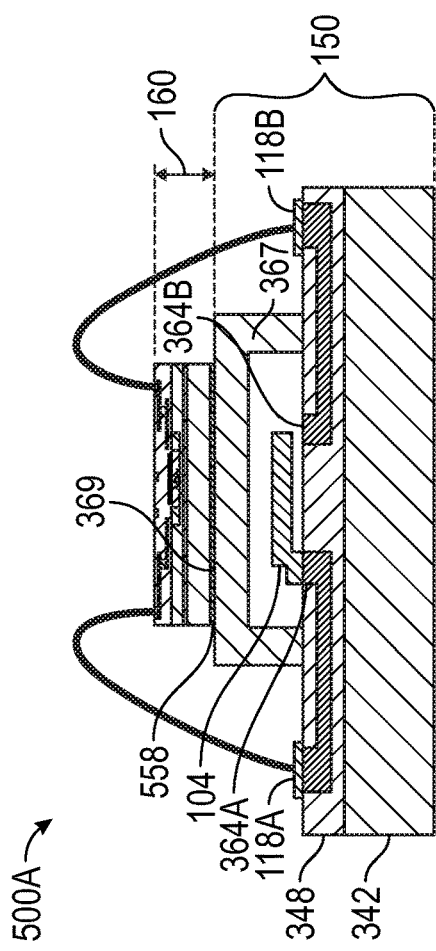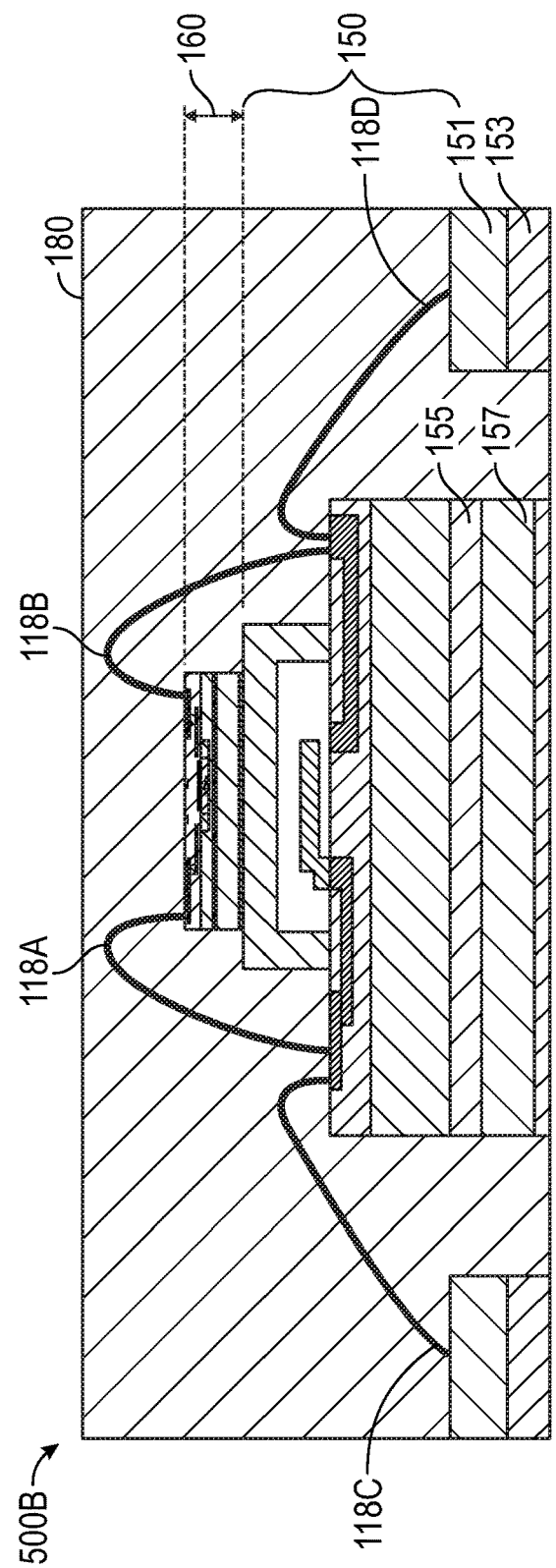

PROTECTION SCHEMES FOR MEMS SWITCH DEVICES

FIELD OF THE DISCLOSURE

This document pertains generally, but not by way of limitation, to integrated micro-electromechanical switch devices and protection circuits coupled thereto.

BACKGROUND

Electrical transients can cause damage to electronic circuits. Such transients can be induced in relation to electrostatic discharge (ESD) events, where bound electric charge can develop significant potentials, such as in excess of 1 kiloVolt (kV) relative to a reference potential. Stored charge can be accumulated through, for example, triboelectric effect (e.g., contact electrification) in relation to ungrounded personnel or equipment, or even induced by proximity to other charged objects. If a discharge path is presented, such as by contact between the personnel or equipment and a sensitive device, the stored charge can be coupled to the sensitive device and discharged through the sensitive device, such as inducing a damaging transient overvoltage condition.

Certain electronic devices, such as devices presenting a relatively high resistance between terminals (e.g., capacitive devices, gate structures in field-effect transistors, or other devices) can be particularly vulnerable to ESD transients or other electrical over-stress conditions. Even though the total stored energy in an ESD transient event is generally insufficient to cause a hazard to personnel, such an overvoltage can still be sufficient to cause dielectric breakdown (e.g., "punch through") of internal structures such as oxide layers, or such overvoltage can even cause arc-induced damage to other structures within electronic devices.

In some cases, damage can also occur to electronic circuits due to environmental conditions such as voltage transients at the inputs to mains-connected (e.g., AC-powered) equipment. Mains-coupled voltage transients can be caused by nearby switching of large loads, or various utility-related fault conditions. Significant electrical fields, more generally, can also cause damage to equipment whether or not it is mains-connected. Such fields can be caused by proximity to lightning strikes, welding equipment, or even proximity to other electrical devices such as fluorescent fixtures.

In yet another example, damage can occur to electronic circuits when such circuits are used in switching applications where the switching is performed in a manner interrupting an established current flow. Interruption of current can cause a momentary voltage transient. Even in low-voltage or low-energy switching applications such as for instrumentation and automated test equipment, such "hot switching" can cause damage to switching devices, including cumulative damage. For example, arc-induced damage can ultimately degrade or destroy the performance of a switching device.

SUMMARY OF THE DISCLOSURE

Micro-electromechanical (MEMS) switch devices can be fabricated using integrated circuit fabrication techniques and materials. Such switch devices can provide cycle life and insertion loss performance suiting a broad range of applications including, for example, automated test equipment (ATE), switching for measurement instrumentation (such as a spectrum analyzer, network analyzer, or communication test system), and uses in communication systems, such as for signal processing. MEMS devices can be vulnerable to electrical over-stress, such as associated with electrostatic discharge (ESD) transient events or other transient overvoltage conditions. A solid-state clamp circuit can be incorporated in a MEMS device package to protect one or more MEMS devices from damaging overvoltage conditions. The clamp circuit can be monolithically integrated with a MEMS device using a commonly-shared substrate, or the clamp circuit can be heterogeneously integrated and be formed on a separate substrate. The clamp circuit can include single or multiple blocking junction structures having complementary current-voltage relationships, such as to help linearize a capacitance-to-voltage relationship presented by the clamp circuit.

In an example, an electronic circuit having a micro-electromechanical switch device and a solid-state clamp circuit can be housed in a commonly-shared integrated circuit device package. The integrated circuit device package can include a first substrate, an integrated micro-electromechanical switch device located upon or within the first substrate, a hermetic enclosure defining a hermetically isolated region to isolate the integrated micro-electromechanical switch device from a surrounding environment, the hermetic enclosure comprising a dielectric material. The solid-state clamp circuit electrically can be coupled to the micro-electromechanical switch and configured to suppress or inhibit damage to the micro-electromechanical switch due to a transient overvoltage condition, and a control circuit can be electrically coupled to the integrated micro-electromechanical switch, the control circuit configured to receive a logic-level signal and to provide a control signal to electrostatically actuate the micro-electromechanical switch in response to the received logic-level signal.

In an example, a method can include providing an electronic circuit having a micro-electromechanical switch device and a solid-state clamp circuit using a commonly-shared integrated circuit device package. The method can include forming an integrated micro-electromechanical switch device upon or within a first substrate, forming a hermetic enclosure defining a hermetically isolated region to isolate the integrated micro-electromechanical switch device from a surrounding environment, the hermetic enclosure comprising a dielectric material, forming a solid-state clamp circuit, and electrically coupling the solid-state clamp circuit to the micro-electromechanical switch to suppress or inhibit damage to the micro-electromechanical switch due to a transient overvoltage condition.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 5A illustrates generally an illustrative example of at least a portion of an integrated circuit device that can include a solid-state clamp circuit stacked upon a portion of a hermetic enclosure of a micro-electromechanical (MEMS) switch device.

FIG. 5B illustrates generally an integrated circuit device package having a lead-frame and a first bond-wire configuration, such as can include an integrated circuit device as shown in FIG. 5A.

Figure 1:
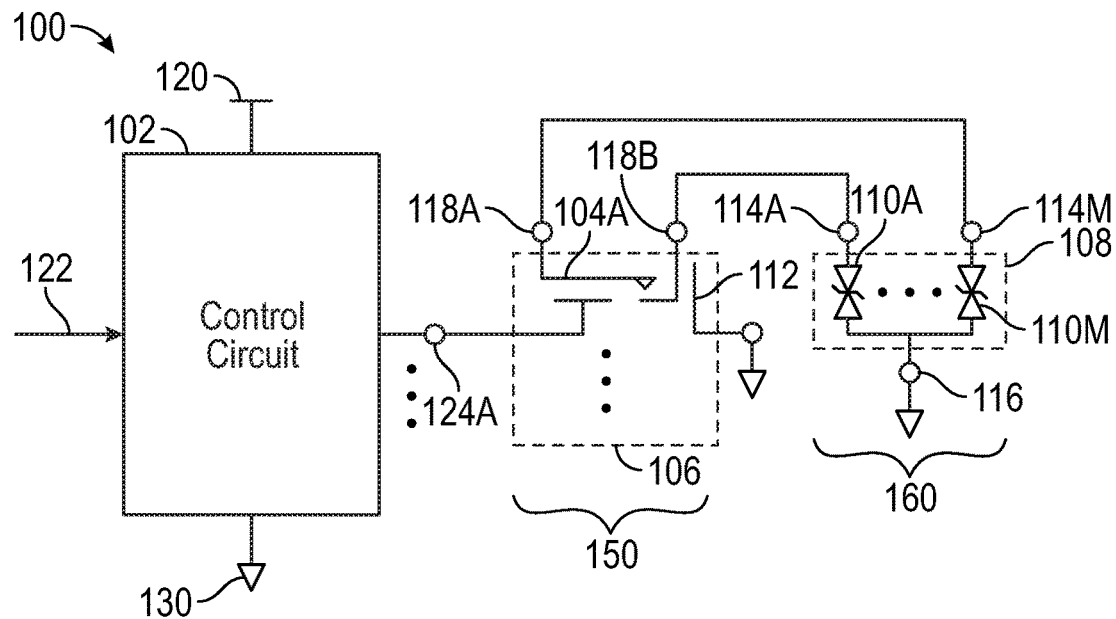
FIG. 1 illustrates generally an example including a diagram of an electronic circuit, the electronic circuit including a control circuit, at least one micro-electromechanical (MEMS) switch device, and a solid-state clamp circuit.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As mentioned above, micro-electromechanical (MEMS) switch devices can be fabricated using integrated circuit fabrication techniques and materials. Such switch devices can provide insertion and return loss performance suitable for use in a broad range of applications. Micro-electromechanical devices are used more generally in other non-switching applications such as for gyroscopes or accelerometers. But, in such motion or position sensing applications, the micro-electromechanical device is generally not exposed to an "interface environment" where damaging voltages could be applied to the micro-electromechanical device terminals.

By contrast, the present inventors have recognized, among other things, that in certain applications, the terminals of such MEMS devices can be electrically exposed to an environment outside the integrated circuit device package through an interface, and are thereby more vulnerable to electrical over-stress, particularly damaging overvoltage transients. For example, use of MEMS switching devices can be desirable in automated test equipment (ATE) applications because such switching devices can offer one or more of higher cycle lifetime, improved linearity, greater bandwidth, more compact form factor, or better loss performance as compared to other approaches such as using mechanical relays (e.g., reed relays) or purely solid-state (e.g., transistor-based) switches. In ATE applications, connectors or other portions of the interface between the device-under-test and other portions of the test system might be handled by users, such as in relation to a "load board" with human accessible nodes. Despite precautions such as protocols for grounding of equipment and personnel, MEMS switch devices may still be damaged by overvoltage conditions, such as induced during an electrostatic discharge (ESD) transient events.

The present inventors have also recognized that other applications can benefit from use of MEMS switch devices, but may also expose the MEMS switch devices to damage. Such applications include measurement equipment, such as incorporating one or more MEMS switching devices in a "front-end" of a spectrum analyzer, a network analyzer, or a communication system test system. Other applications include circuits such as signal processors or communications circuits, such as can include inputs or outputs switched using MEMS switch devices. Communication circuits can include wireless or mobile devices, as illustrative examples. Accordingly, the present inventors have recognized among other things, that solid-state semiconductor circuit such as a clamp circuit can be coupled to one or more MEMS switch devices, such as to protect the one or more MEMS switch devices from damage due to a transient overvoltage condition. ESD transient events are one class of overvoltage conditions. A semiconductor-based clamp circuit can be used to protect a MEMS switch device from other transients, such as when established current flow is interrupted by the MEMS switch device during a "hot switching" event.

The present inventors have developed a variety of configurations and techniques for combining a solid-state semiconductor circuit with one or more or more MEMS devices in a commonly-shared integrated circuit device package. Such configurations can include monolithic integration of both a MEMS device and a solid-state clamp circuit on or within a commonly-shared substrate, or heterogeneous integration of a solid-state clamp circuit with a MEMS device in a commonly-shared device package. Integration of a protection circuit such as a solid-state clamp circuit in the same device package as one or more MEMS switch devices can provide enhanced electrical performance as compared to using a separate external protection circuit. Such integration can also be used to provide system-on-chip (SoC) or system-in-package (SiP) devices, incorporating other circuits.

FIG. 1 illustrates generally an example including a diagram of an electronic circuit 100, the electronic circuit including a control circuit 102, at least one micro-electromechanical (MEMS) switch device 150, and a solid-state clamp circuit 160. A control input 122 can be coupled to the control circuit. The control input can be configured to receive a logic-level signal indicating a desired state for the MEMS switch device 150 (corresponding to an actuated or de-actuated state). In response to a logic-level signal received at the control input 122, the control circuit 102 can provide a control signal using an output 124A, such as coupled to a gate of the MEMS switch device 150, to electrostatically actuate the MEMS switch device 150 by inducing movement in a beam 104A or other structure to electrically couple a first terminal 118A (e.g., a "source" terminal) to a second terminal 118B of the MEMS switch device 150 (e.g., a "drain" terminal). One or more of a shield, guard, or substrate conductor 112 can be provided, such as to electrostatically or electromagnetically shield the MEMS switch device 150 from other devices. A housing 106 can be provided for the MEMS switch device 150, such as to hermetically isolate the MEMS switch device 150 from a surrounding environment. As discussed in relation to other examples described herein, the housing 106 can be formed using one or more of semiconductor substrates or a cap structure, such as an insulating cap.

As mentioned above, the MEMS switch device 150 can be vulnerable to a transient overvoltage condition, particularly in the open-circuit state. Accordingly, the solid-state clamp circuit 160 can be coupled to one or more terminals of the MEMS switch device 150. As an illustrative example, respective ones of the terminals of the MEMS switch device 150 can be coupled to a corresponding solid-state clamp structure 110A. For example, a terminal 114A of the clamp circuit 160 can be electrically coupled to the corresponding terminal 118A of the MEMS switch device 150, and a second terminal 114B of the clamp circuit 160 can be electrically coupled to the corresponding terminal 118B of the MEMS switch device 150. Such electrical couplings can include wire-bonded interconnections, metallization on one or more of an integrated circuit or laminate substrate, or other structures, according to various examples.

A reference node 130 can be coupled to one or more of the control circuit 102 or other portions of the circuit 100 of FIG. 1, such as a common node terminal 116 of the clamp circuit 160. As shown illustratively in the example of FIG. 2, the control circuit 102, the MEMS switch device 150 and the clamp circuit 160 can have commonly-shared or isolated reference potential (e.g., "ground") domains. A positive supply voltage node 120 can also be coupled to control circuit 102. As shown and described in various examples herein, the MEMS switch device 150 and clamp circuit 160 can be co-integrated using a commonly-shared integrated circuit package, or even co-integrated monolithically on a commonly-shared substrate.

Figure 2:
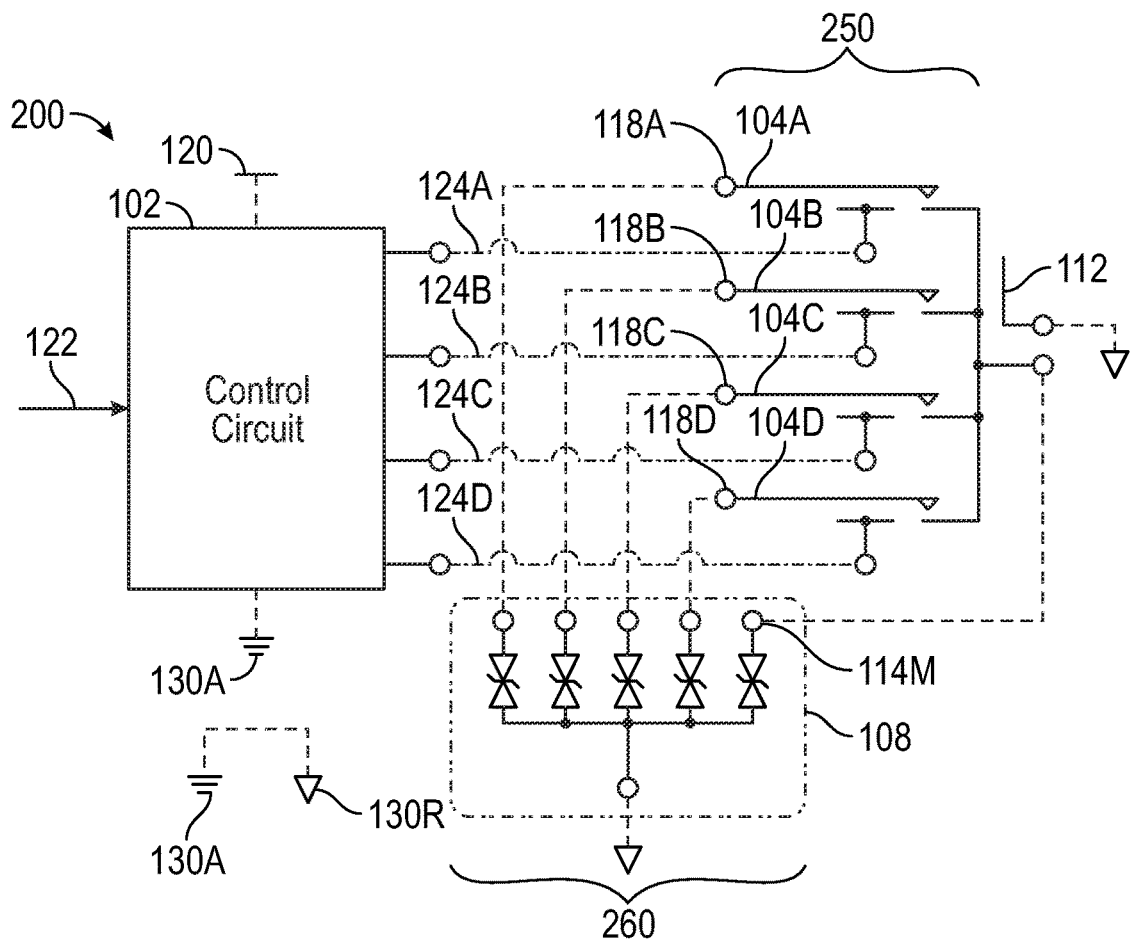
FIG. 2 shows an illustrative example of a single-pole four-throw (SP4T) switching arrangement of an electronic circuit, such as can include a control circuit, four micro-electromechanical (MEMS) switch devices, and a solid-state clamp circuit.

FIG. 2 shows an illustrative example of a single-pole four-throw (SP4T) switching arrangement of an electronic circuit 200, such as can include a control circuit 102 coupled to a first reference node 130A (e.g., "analog ground"), four micro-electromechanical (MEMS) switch devices 250, and a solid-state clamp circuit 260. The control circuit 102 can include an input 122 and respective outputs 124A, 124B, 124O, and 124D coupled to respective gate inputs of the MEMS switch devices 250. The MEMS switch devices 250 can include first terminals 118A, 118B, 118C, and 118D (e.g., "source terminals") and a comply-shared second terminal (e.g., a "drain"). One or more of a shield, guard, or substrate conductor 112 can be coupled to a second reference node 130R (e.g., an "RF ground."). Elsewhere in the electronic circuit, such as elsewhere within a device package, the first and second reference terminals can be electrically coupled.

The solid-state clamp circuit 260 can be formed upon or within a substrate 108, such as separate from a substrate used for the MEMS switch devices 250, or using a commonly-shared substrate. The dashed lines shown in FIG. 2 can indicate electrical couplings between the solid-state clamp circuit and other portions of the electrical circuit 200, with such couplings including one or more of wire-bonded interconnections, metallization on one or more of an integrated circuit or laminate substrate, or other structures, according to various examples.

Figure 3:
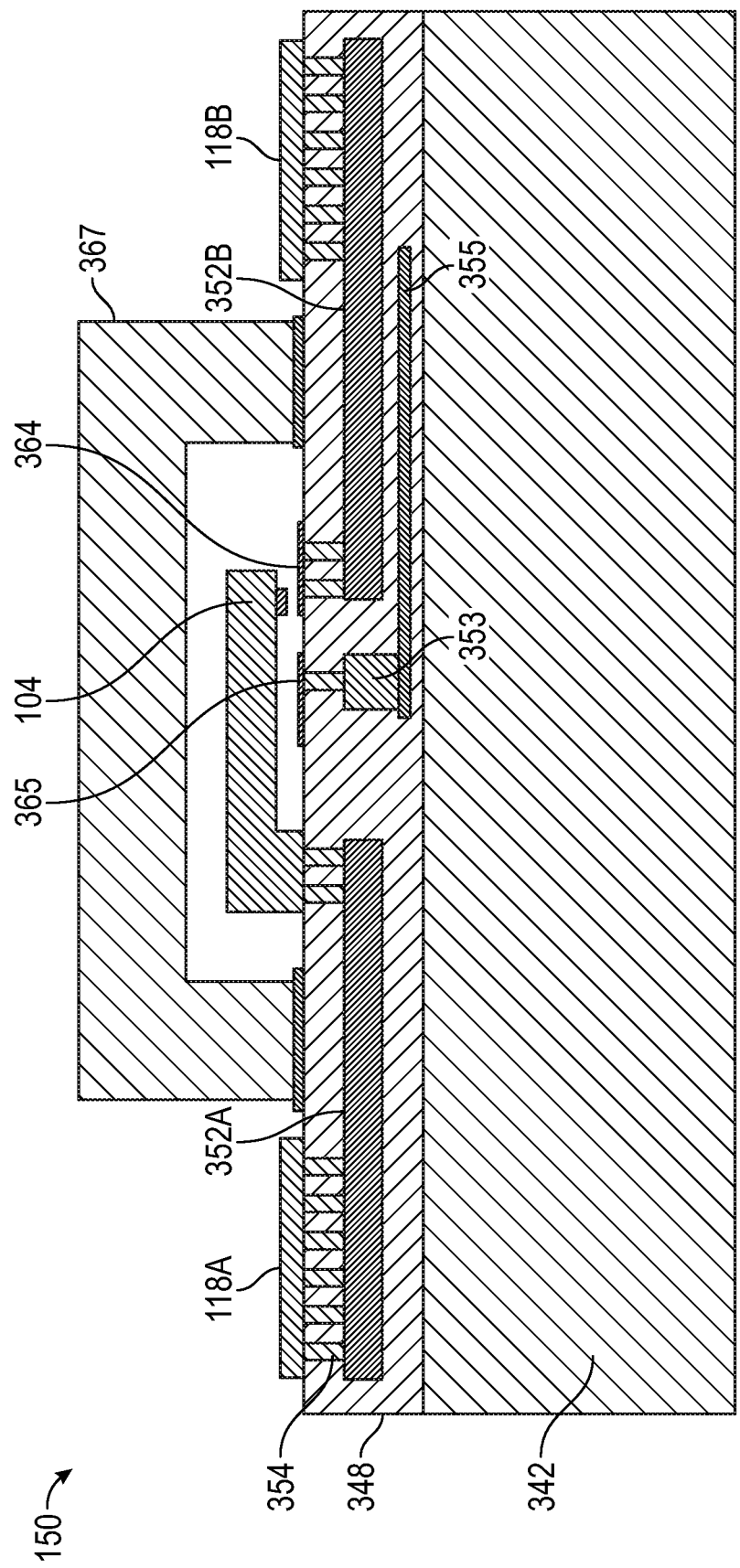
FIG. 3 illustrates generally an example that can include an integrated circuit device comprising a micro-electromechanical (MEMS) switch.

FIG. 3 illustrates generally an example that can include an integrated circuit device comprising a micro-electromechanical (MEMS) switch device 150. A high-resistivity silicon wafer substrate 342 can be used, such as having a resistive of about 1000 ohm-centimeters (Ω-cm), and such as can include a p-type dopant. An oxide layer 348 can be formed on the substrate 342. One or more metallization layers can be formed on or within the oxide layer. For example, aluminum interconnections 352A and 352B can be formed, such as to couple a cantilevered beam 104 (e.g., a gold (Au) beam) and a contact 364 to terminals 1118A and 1118B (e.g., gold wire-bond pads or other terminals), respectively, such as using one or more via structures (e.g., a tungsten via 354). A gate portion 365 of the MEMS switch device 150 can be coupled to a terminal elsewhere, such as through a resistor 355 (e.g., a polysilicon resistor). The resistor can include a thin-film resistor internal to the oxide layer 348, such as coupled to a metallization 353 and corresponding via between the metallization 353 and the gate portion 365. When a suitable voltage is applied to the gate portion 365 with reference to a potential at the beam 104 (e.g., a "gate-source" voltage, $V_{GS}$), the beam will be electrostatically attracted and contact metal on the beam will conductively couple the beam to the contact 364, closing the switch device 150. As can be seen from FIG. 3, the MEMS switch device 150 is vulnerable to electrical overstress, such as might damage the beam 104, contact 364, or insulating portions of the switch device 150 such as the gate structure, oxide layer 348, or even a hermetic cap 367. As an illustrative example, the hermetic cap can include silicon (e.g., intrinsic silicon), such as can be conductively isolated (e.g., insulated) from other portions of the MEMS switch device 150. As an illustrative example, the source-to-drain breakdown voltage for a MEMS switch device 150 as shown in FIG. 3 can be about 100V, and a breakdown voltage from the source or drain terminals to a reference node (e.g., RF ground) can be about 200V.

Generally, the switch device 150 structure in FIG. 3 can be referred to as a "cantilever" switch cell, where, as mentioned above, an electrostatic force, $F_{ELEC}$ can attract the beam 104 to the contact 364, and a mechanical spring force, $F_{MECH}$ can restore the beam 104 to an "open" circuit position separated from the contact 364 when $F_{ELEC}$ is suppressed or inhibited. The protection and integration techniques described in this document are applicable to other MEWS structures, such as a switch structure having an "active opening architecture." For example, a "teeter totter" switch architecture can be used, such as having a source electrode located generally centrally along a beam. The beam can rotate about a fulcrum established at or near the source electrode location. Respective gate electrodes can be located laterally with respect to the fulcrum, such as at or near distally-extended ends of the beam extending outward from the fulcrum. In this manner, the beam can be forced electrostatically to open and close (e.g., an electrostatic force can be used to open the switch, and another electrostatic force can be used to close the switch).

Figure 4A:
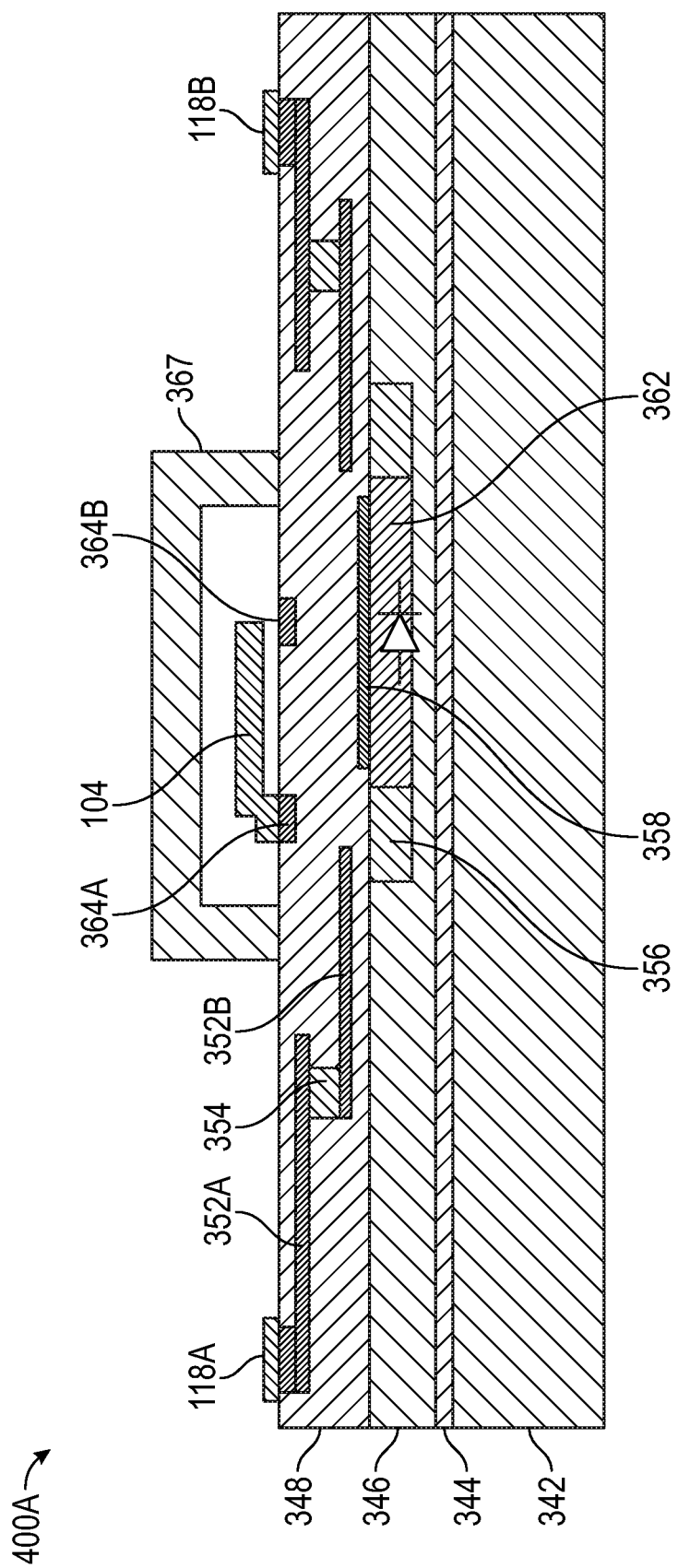
FIG. 4A illustrates generally an example showing a side view (e.g., a section view) of an electronic circuit including a micro-electromechanical (MEMS) switch device and a solid-state clamp circuit monolithically integrated together using a silicon-on-insulator substrate configuration.

FIG. 4A illustrates generally an example showing a side view section view) of an electronic circuit 400A including a micro-electromechanical (MEMS) switch device and a solid-state clamp circuit monolithically integrated as a portion of a commonly-shared substrate 342 using a silicon-on-insulator substrate configuration. As in the example of FIG. 3, the substrate 342 can include a high-resistivity silicon wafer substrate. By contrast with FIG. 3, a buried oxide (BOX) layer 344 can be included, such as having a thickness of about 1.1 micrometers (1.1 μm) according to an illustrative example, or having another thickness. An active silicon layer 346 can be formed upon the BOX layer 344, such as having a thickness of about 2.4 micrometers, a resistivity of about 10 ohm-cm, and such as having a P-type conductivity, according to an illustrative example. An oxide layer 348 can be formed upon the active silicon layer 346, such as including one or more metallization layers (e.g., aluminum metallization layers 352A and 352B, such as coupled to each other using a via structure (e.g., a tungsten via 354). In this manner, similar to FIG. 3, a contact 364A such as coupled to a beam 104 of the MEMS switch device can be electrically coupled to a terminal 118A (e.g., a source terminal). Similarly, a second contact 364B can be coupled to a second terminal 118B (e.g., a drain terminal). A solid-state circuit such as a clamp circuit can be formed directly below the MEMS switch device 250, such as can include one or more diode devices. In an example, a bipolar plus complementary metal-oxide-semiconductor process or "BiCMOS" fabrication process can be used, such as to form diode and silicon-controlled rectifier (SCR) devices monolithically. In an example, a Silicon-Germanium (SiGe) BiCMOS process flow can be used. Regions in FIG. 4A illustrate generally portions of semiconductor devices, such as illustrating generally a field-effect transistor (FET) structure having conducting terminals such as a source/drain region 356, a gate structure 358, and a channel region 362. Another source/drain region can be located laterally opposite the source/drain region 356, such as on the opposite side of the channel region 362. The regions 356 and 362, and gate 358 are illustrative. Other device structures can be formed in such regions, such as one or more bipolar devices, diode structures, or other circuits.

Figure 4B:
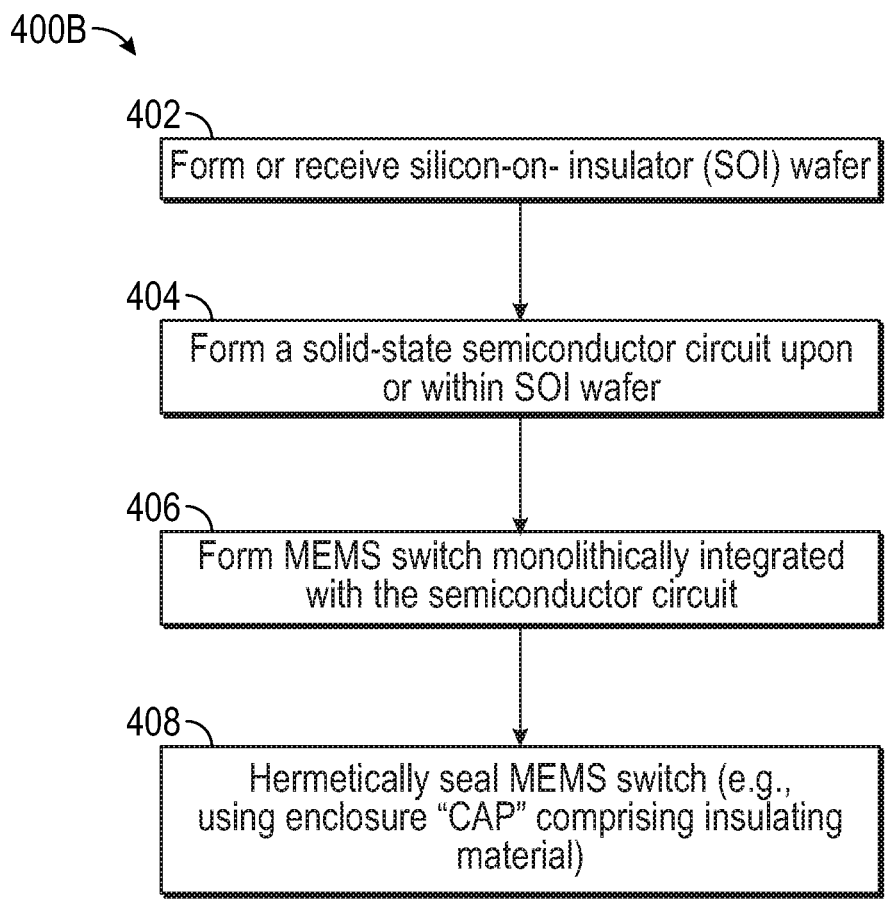
FIG. 4B illustrates generally a technique, such as a method, that can include various operations to fabricate a micro-electromechanical (MEMS) switch device and a solid-state clamp circuit monolithically integrated together using a silicon-on-insulator substrate configuration.
Figure 4C:
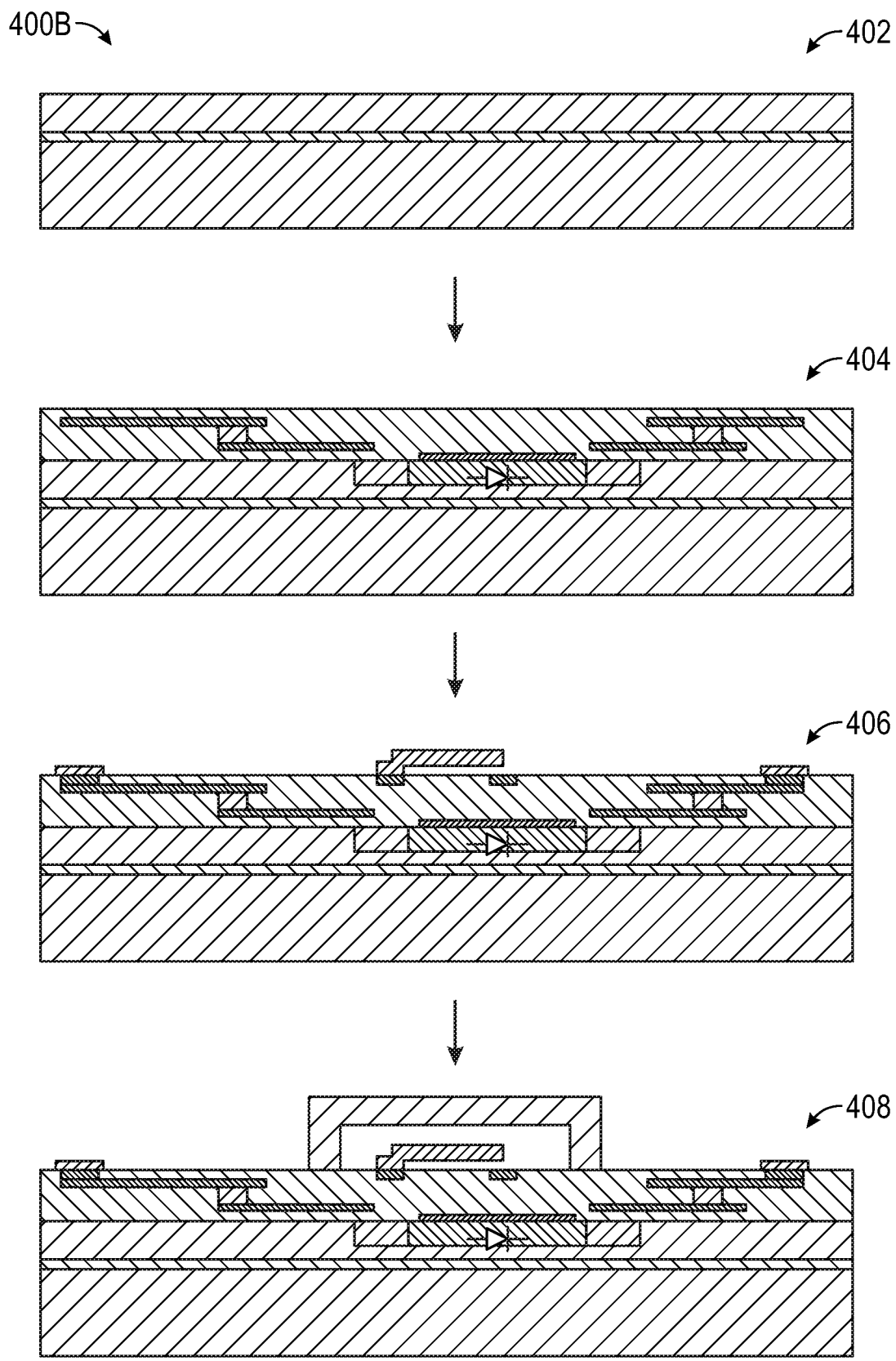
FIG. 4C also illustrates generally a technique, such as a method, that can include various operations to fabricate a micro-electromechanical (MEMS) switch device and a solid-state clamp circuit monolithically integrated together using a silicon-on-insulator substrate configuration, as a diagrammatic representation of FIG. 4B.

FIG. 4B illustrates generally a technique 400B, such as a method, that can include various operations to fabricate a micro-electromechanical (MEMS) switch device and a solid-state clamp circuit monolithically integrated together using a silicon-on-insulator substrate configuration, such as to provide the electronic circuit 400A shown in FIG. 4A. FIG. 4C also illustrates generally the technique 400B, as an example including a diagrammatic representation of FIG. 4B. Referring to both FIG. 4B and FIG. 4C, at 402, a silicon-on-insulator (SOI) substrate configuration can be formed or received, such as having layer thicknesses as mentioned above in relation to the description of FIG. 4A. Use of an SOI substrate configuration is illustrative, and other substrate configurations can be used. Use of an SOI substrate configuration can allow integration of the MEMS switch device and a solid-state semiconductor circuit (e.g., a clamp circuit) along with other circuitry, such as for one or more of high-frequency or mixed-signal applications.

Figure 9A:
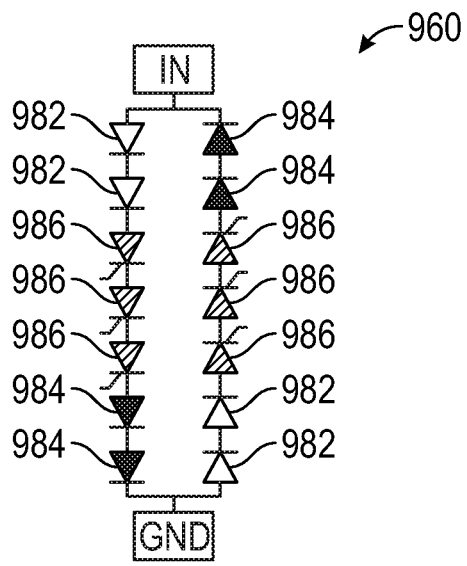
FIG. 9A illustrates generally a schematic representation of a solid-state clamp circuit, such as can include integrated diode devices having complementary capacitance-to-voltage relationships arranged to provide a linear or approximately linear overall capacitance-to-voltage relationship for the clamp circuit.

At 404, a solid-state semiconductor circuit can be formed, such as a solid-state clamp circuit as shown and described in relation to other examples herein, such as shown schematically in the example of FIG. 9A. Forming the solid-state semiconductor circuit can include forming device structures and electrical interconnects, such as including semiconductor material and metallization layers. At 406, the MEMS switch device can be formed, such as directly above (or laterally offset) from the solid-state semiconductor circuit. The MEMS switch device can be electrically coupled to other circuits monolithically integrated using the commonly-shared substrate provided at 402. The MEMS switch can include a configuration as shown generally in FIG. 3 or other examples described herein. At 408, the MEMS switch can be hermetically isolated from a surrounding environment such as using a "cap." The cap can include an electrically-insulating material such as a dielectric or intrinsic semiconductor.

FIG. 5A illustrates generally an illustrative example of at least a portion of an integrated circuit device package 500A that can include a solid-state clamp circuit 160 stacked upon a portion of a hermetic enclosure 367 (e.g., "cap") of a micro-electromechanical (MEMS) switch device 250, such as conductively isolated from the hermetic enclosure 367 by an insulated die attach material 369. In this example, the solid-state clamp circuit 160 is "heterogeneously" integrated using a second substrate with the first substrate 342 of the MEMS switch device 150, such as housed within a commonly-shared device package.

The present inventors have recognized, among other things, that locating a solid-state semiconductor die, such as the clamp circuit 160, upon the hermetic enclosure 367 can provide acceptable electrical performance (e.g., providing one or more of isolation performance, insertion loss performance, or return loss performance comparable to a circuit lacking the loading of the clamp circuit 160), along with a compact mechanical configuration to allow electrical interconnection between the clamp circuit 160 and the MEMS switch device 150. For example, first and second terminals 118A and 118B of the MEMS switch device 150 can be electrically coupled to the clamp circuit 160 using wire bonds. A portion of the MEMS switch device 150, such as a beam 104 can be coupled to the first terminal 118A, such as through a first conductive coupling including one or more contacts, vias, or metallization layers within an oxide layer 348, and similarly, a second conductive coupling 364B elsewhere can be coupled to the second terminal 118B. The oxide layer 348 can be formed upon a high-resistivity silicon substrate 342, such as a p-type conductivity substrate having a resistivity of about 1000 ohm-cm. In FIG. 5A, the wire-bond connections are shown as located directly between the MEMS switch device 150 and the solid-state clamp circuit 160.

The solid-state clamp circuit 160 can include an SOI substrate configuration, such as having a high-resistivity substrate, a buried oxide layer, and a thin slice of active material as mentioned in relation to other examples described herein. A physical layout of the solid-state clamp circuit can be formed as shown illustratively in FIG. 10, such as including device structures as shown and described elsewhere herein.

Figure 5C:
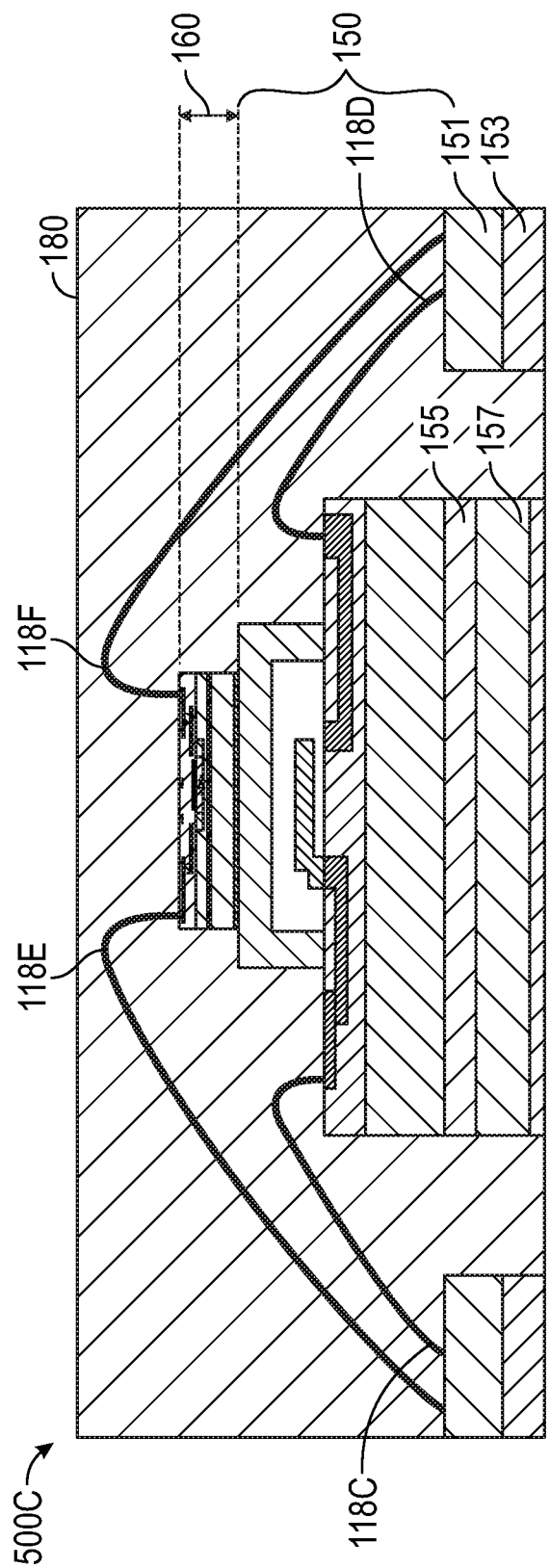
FIG. 5C illustrates generally an integrated circuit device package having a lead-frame and a second bond-wire configuration, such as can include an integrated circuit device as shown in FIG. 5A.

FIG. 5B and FIG. 5C illustrate generally two variations in bond-wire arrangements, such as can be used in forming integrated device packages 500B or 500C, respectively. As mentioned above in relation to FIG. 5A, a solid-state semiconductor circuit such as a solid-state clamp circuit 160 can be stacked upon a portion of a MEMS switch device 150, such as encapsulated within the integrated circuit device packages 500B or 500C using an encapsulant or overmolding material 180. In the example of FIG. 5B, the integrated circuit device package 500B includes bond wires 118A and 188B between terminals of the solid state clamp circuit 160 and the MEMS switch device 150. External terminals of the package 500B, such as a terminal 153, can be electrically coupled to the MEMS switch device 150 and solid-state clamp circuit 160 such as through bond wires between a lead frame 151 (e.g., a copper lead frame) and the MEMS switch device 150. The substrate of the MEMS switched device 150 die can be attached, such as using an epoxy 155 or other die mount adhesive, to a die-attach region (e.g., a die-attach "paddle" of the lead frame 151). Referring to FIG. 5C, the integrated circuit device package 500C can be similar to the package 500B of FIG. 5B, but the wire-bond configuration can include wire-bonds 118E and 115E directly between the solid-state clamp circuit 160 die and the lead-frame 151, rather than between the clamp-circuit 160 and the MEMS switch device 150.

Figure 8:
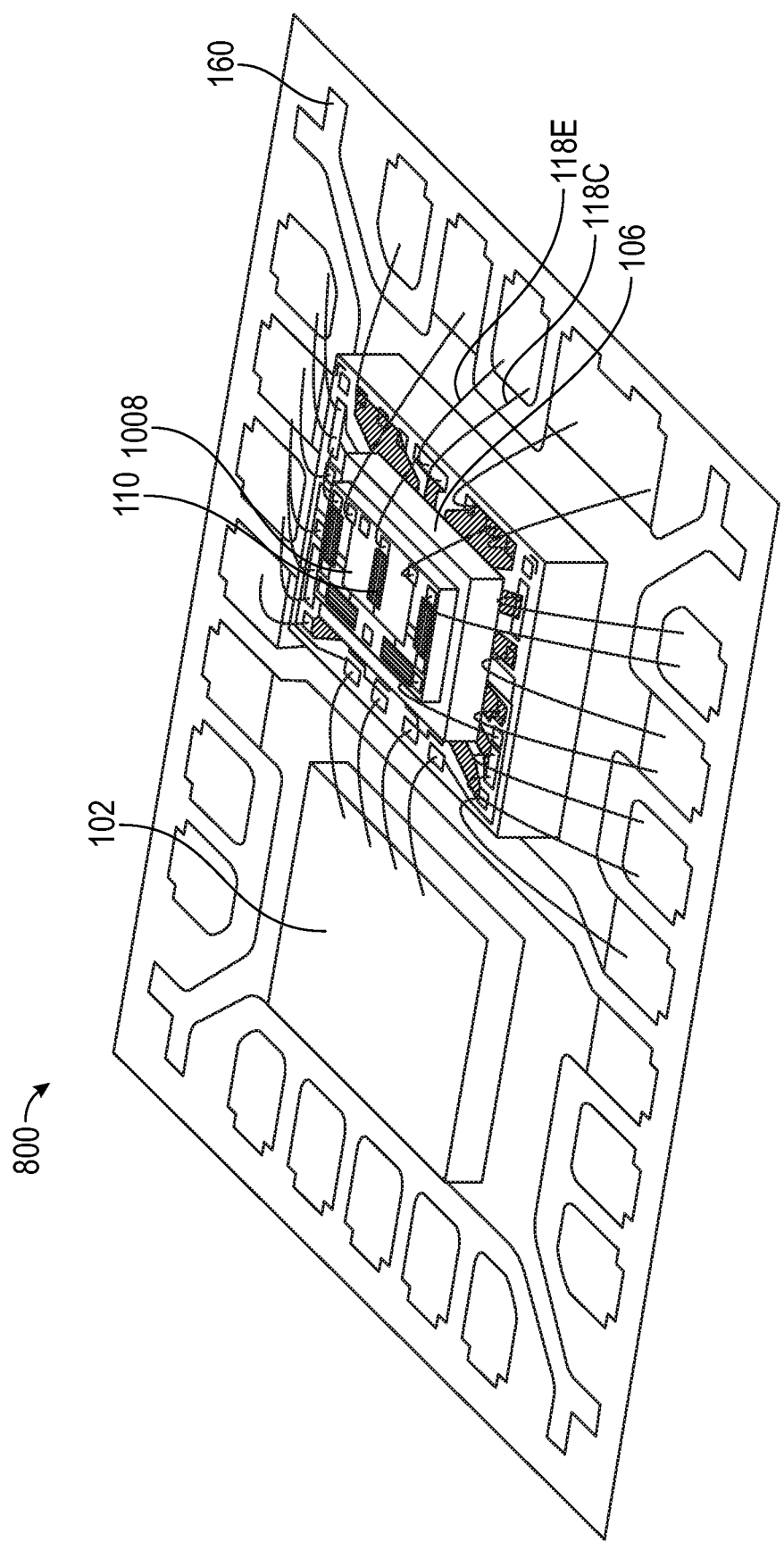
FIG. 8 illustrates generally at least a portion of an integrated circuit device package, such as including a control circuit semiconductor die, a micro-electromechanical (MEMS) switch device, and a solid-state semiconductor die (e.g., a solid-state clamp circuit) stacked upon a portion of a hermetic enclosure housing the MEMS switch device.

A perspective view of a lead-frame 151 portion of a device package, including a control circuit, along with a stacked MEMS switch device 150 and solid-state clamp circuit 160 is shown illustratively in FIG. 8, such as can include a mechanical configuration as shown illustratively in one or more of FIG. 5A, FIG. 5B, or FIG. 5C.

Figure 6:
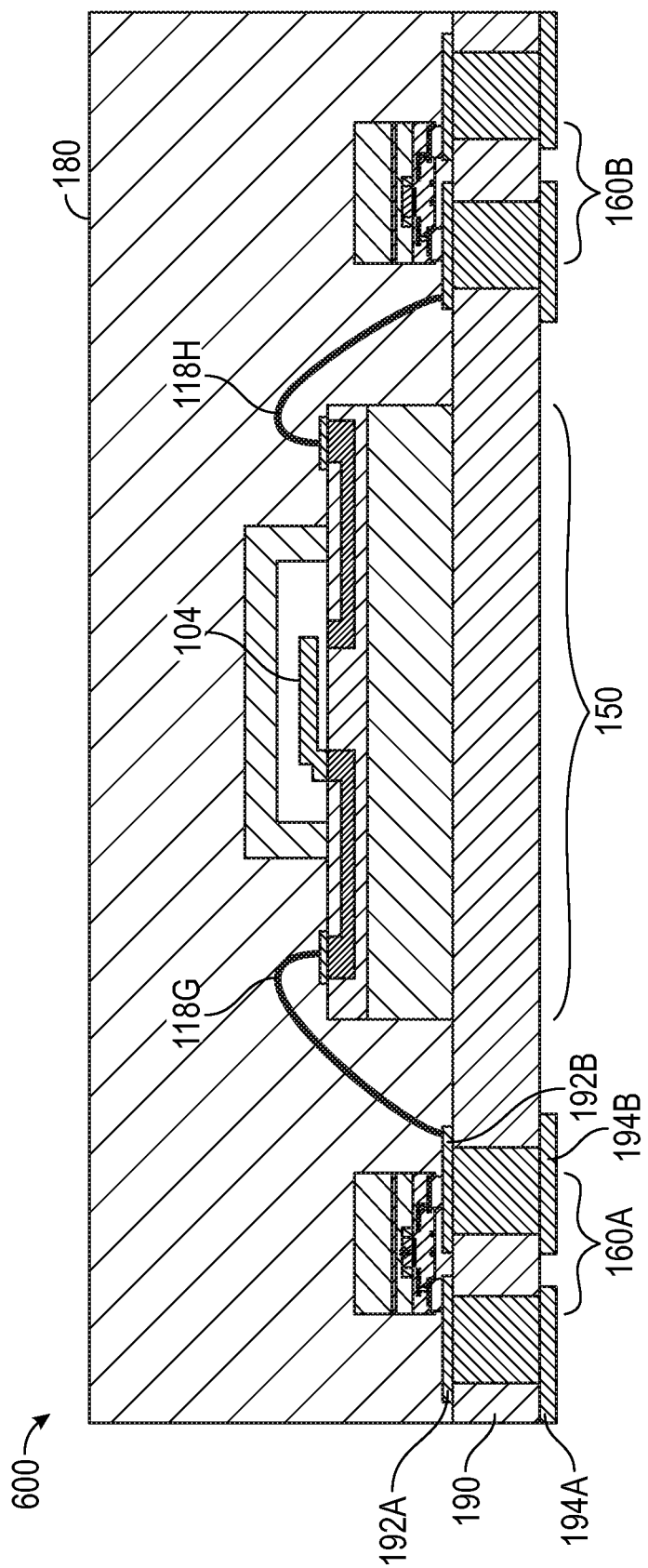
FIG. 6 illustrates generally an integrated circuit device package such as can include a dielectric substrate (e.g., a laminate), where the integrated circuit device package includes one or more solid-state clamp devices along with one or more micro-electromechanical (MEMS) switch devices.

Referring to FIG. 6, FIG. 6 illustrates generally an integrated circuit device package 600 such as can include a dielectric substrate 190 (e.g., a laminate), where the integrated circuit device package includes one or more solid-state clamp devices 160A or 160B (or other semiconductor devices) along with one or more micro-electromechanical (MEMS) switch devices, such as a MEMS switch 150. Suitable dielectric materials can include one or more of an epoxy or glass-epoxy laminate (e.g., FR-4, FR-406), bizmaleimide-triazine (BT), polyimide, or other materials. In the example of FIG. 6, one or more solid-state devices such as clamp circuit 160A or a clamp circuit 160B can be located laterally from a MEMS switch device.

The solid-state semiconductor devices can include a silicon-on-insulator (SOI) substrate configuration, such as flipped for electrical and mechanical attachment to pads on the laminate. For example, one or more of the clamp circuits 160A or 160B can include a pillared or bumped die mounted to corresponding pads included as a portion of the dielectric 190, such as the clamp circuit 160A and pads 192A and 192B. One or more pad locations can be used to provide a landing zone for a wire-bond connection, such as shown in pad 192B. The laminate can include one or more through-via or buried-via structures, such as to electrically couple external terminals such as a terminal 194A or a terminal 194B to internal circuitry of the device package 600. Such interconnects can include metallization layers coupled to each other using via structures, or a lead frame structure (e.g., a copper lead frame), overmolded or encapsulated to provide the dielectric 190 portion of the package. Another encapsulant or overmold material 180 can be used to provide a unitized integrated circuit package.

The use of solid-state clamp circuits 160A or 160B in FIG. 6 is an illustrative example. Other semiconductor circuits such as discrete devices, discrete dice, or packaged devices can be co-integrated in the commonly-shared device package 600, such as by electrically and mechanically coupling such devices to the laminate. Interconnections between such devices can be provided by metallization included as a portion of the laminate structure or by other techniques such as wire bonding or lead-frame routing. In an illustrative example, discrete diode devices (or diode pairs) can be included in respective packaged devices, such as placed upon the laminate substrate, and then encapsulated or overmolded with a material 180.

Figure 7:
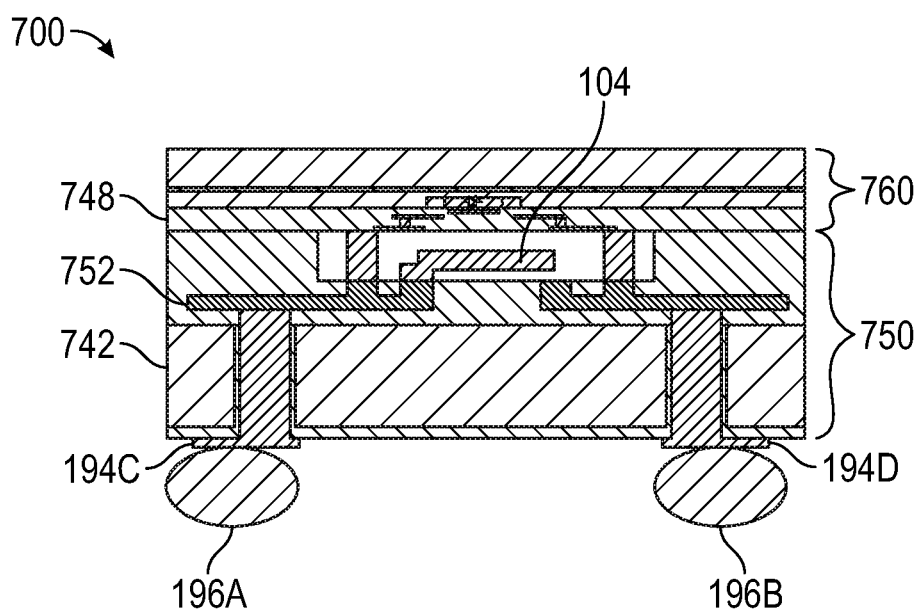
FIG. 7 illustrates generally an integrated circuit device package such as can include a through-silicon via (TSV) configuration, such as including a solid-state semiconductor die as a portion of a hermetic enclosure for a micro-electromechanical (MEMS) switch device.

FIG. 7 illustrates generally an integrated circuit device package 700 such as can include a through-silicon via (TSV) configuration, such as including a solid-state semiconductor die 760 as a portion of a hermetic enclosure for a micro-electromechanical (MEMS) switch device 104. Through-silicon via structures can couple pads 194C and 194D to respective conductive (e.g., "metal") regions on or within a micro-electromechanical switch substrate 750. A high-resistivity substrate 742, such as a silicon substrate having p-type conductivity and a resistivity of 1000 Ohm-cm can be used. A metal layer 752 can be located within an active silicon region, such as having p-type conductivity and a resistivity of 10 Ohm-cm, as an illustrative example. The die 760 can include a silicon-on-insulator configuration, such as similar or identical to the solid-state claim circuit 160 shown illustrative in FIG. 5A. Referring back to FIG. 7, the pads 194C and 194D can be bumped or pillared, such as including one or more of a copper pillar or solder bump to provide an electrical and mechanical interconnection between the device package 700 and other circuits.

FIG. 8 illustrates generally at least a portion of an integrated circuit device package 800, such as including a control circuit semiconductor die 102, a micro-electromechanical (MEMS) switch device within a housing 106 (e.g., a cap), and a solid-state semiconductor die 1008 (e.g., a solid-state clamp circuit) stacked upon a portion of a hermetic housing 106 of the MEMS switch device. One or more wire bonds can be provided to couple the MEMS switch device and the solid-state semiconductor die 1008 to a lead frame 160 or to pads located on a laminate substrate as in other examples. For example, in a manner similar to the configuration shown in FIG. 5C, respective bond wires 118E and 118C can couple the semiconductor die 1008 and the MEMS switch device to the lead frame 160, respectively. Other configurations can be used, such as having one or more electrical interconnects directly between the semiconductor die 1008 and the MEMS switch device (such as shown in FIG. SB, illustratively). As in other examples, the package 800 can be capped, encapsulated, or overmolded.

FIG. 9A illustrates generally a schematic representation 960 of a solid-state clamp circuit, such as can include integrated diode devices having complementary capacitance-to-voltage relationships arranged to provide a linear or approximately linear overall capacitance-to-voltage relationship for the clamp circuit. In FIG. 9A, silicon-controlled rectifier circuits 986 can provide a portion of the protection circuit, such as arranged in complementary branches as shown in FIG. 9A to provide protection for positive-going or negative-going voltage swings with respect to the reference node (e.g., "GND"). Diodes having a first architecture 982 (shown in detail in FIG. 12A and having an equivalent circuit modeled as shown in FIG. 12B) can provide a first capacitance-to-voltage relationship. Diodes having a second architecture 984 (shown in detail in FIG. 13A and having an equivalent circuit modeled as shown in FIG. 13B) can provide a second capacitance-to-voltage relationship that is substantially or exactly complementary to the relationship provided by the diodes having the first architecture 982. A series arrangement of such diodes 982 and 984 can provide compensation for an overall non-linearity in capacitance-to-voltage presented by the solid state clamp circuit.

Generally, the diodes 982 and 984 shown in FIG. 9A are connected and physically realized so that a substrate capacitance (shown as $C_{SUB}$ in FIG. 12B and FIG. 13B) does not load the input node (e.g., "IN"). In this manner, the circuit can be used for protection in applications related to automated test or communications, as illustrative examples, where high-speed signals or RF signals are present (such as when the clamp circuit is used to protect a switching device such as a micro-electromechanical switch device).

Figure 9B:
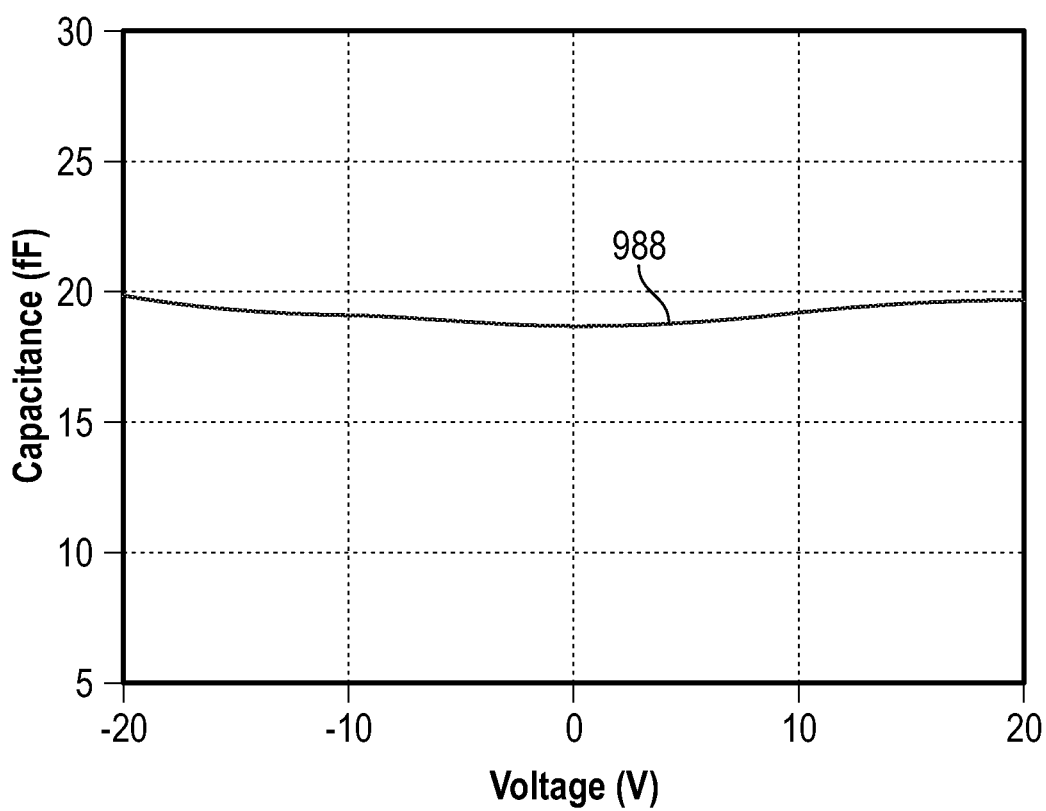
FIG. 9B illustrates generally an illustrative example of a capacitance-to-voltage relationship that can provided, such as using a circuit as shown in FIG. 9A, operating in a voltage range extending from about −20V to about +20V, relative to a reference voltage.

FIG. 9B illustrates generally an illustrative example of a capacitance-to-voltage relationship 988 that can be provided, such as using a circuit as shown in FIG. 9A, operating in a voltage range extending from about −20V to about +20V, relative to a reference voltage. The use of a range from about −20V to about +20V is illustrative, and other voltage ranges can be similarly protected, such as by adjusting a count of protection devices included in each of the branches shown illustratively in the schematic representation 960 of FIG. 9A. The illustrative example of FIG. 9B was obtained via measurement of a device structure corresponding to the physical layout of FIG. 10, and including device structures as illustrated generally in FIG. 11, FIG. 12A, and FIG. 12B.

Figure 10:
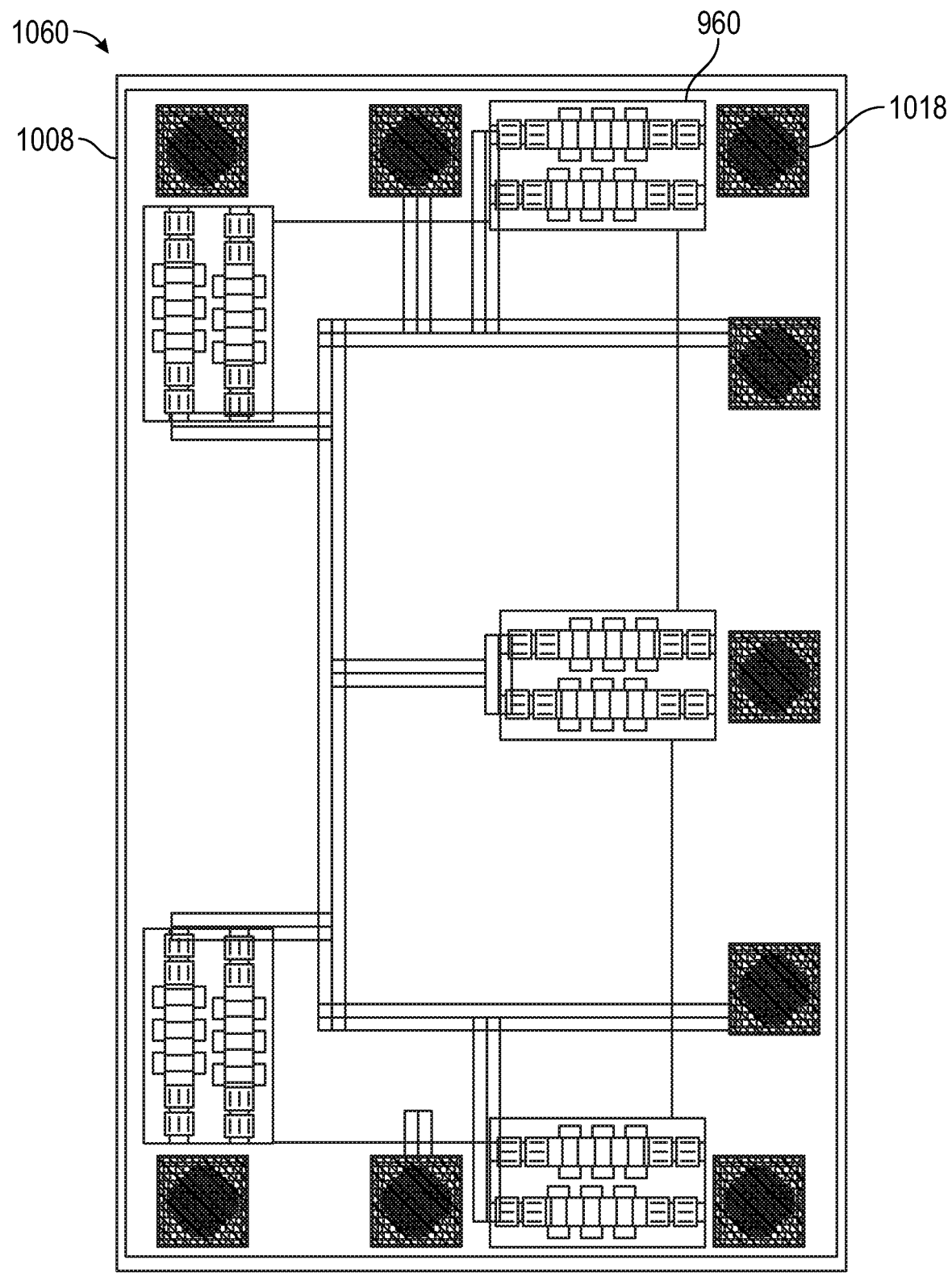
FIG. 10 illustrates generally an illustrative example comprising a physical layout for a solid-state semiconductor die, such as can include five solid-state clamp circuits, such as to provide protection for a single-pole four-throw (SP4T) micro-electromechanical switch arrangement.

FIG. 10 illustrates generally an illustrative example comprising a physical layout for a solid-state semiconductor die 1008, such as can include five solid-state clamp circuits, such as to provide protection for a single-pole four-throw (SPOT) micro-electromechanical switch arrangement (for example, the switch arrangement 250 as shown in FIG. 2, where the die 1008 provides the solid-state clamp circuit 260 including five instances of the clamp circuit 960 as shown in FIG. 9A). The die 1008 can include various elements to facilitate use in applications such as protection of switching devices carrying high-speed or RF signals. For example, a substrate of the die 1008 can be electrically floating (e.g., not conductively coupled) to a cap or other portions of an underlying MEMS switch device. Such a floating configuration can reduce parasitic loading on the protected nodes. One or more metal layers can be used to form an electrostatic or electromagnetic shield structure on or within the substrate of the die 1008. Reference nodes (e.g., "GND") nodes of respective ones of the clamp circuit 960 can be coupled together using a controlled-impedance or low-impedance structure, such as using a metal layer buried within the substrate of the die 1008. The die can include a silicon-on-insulator configuration as mentioned in relation to other examples herein. To facilitate compatibility with high-speed signals, a bond-pad structure 1018 such as having one of the configurations shown in FIG. 14A or FIG. 14B can be used, such as to isolate high-frequency currents from coupling into the substrate.

Figure 11:
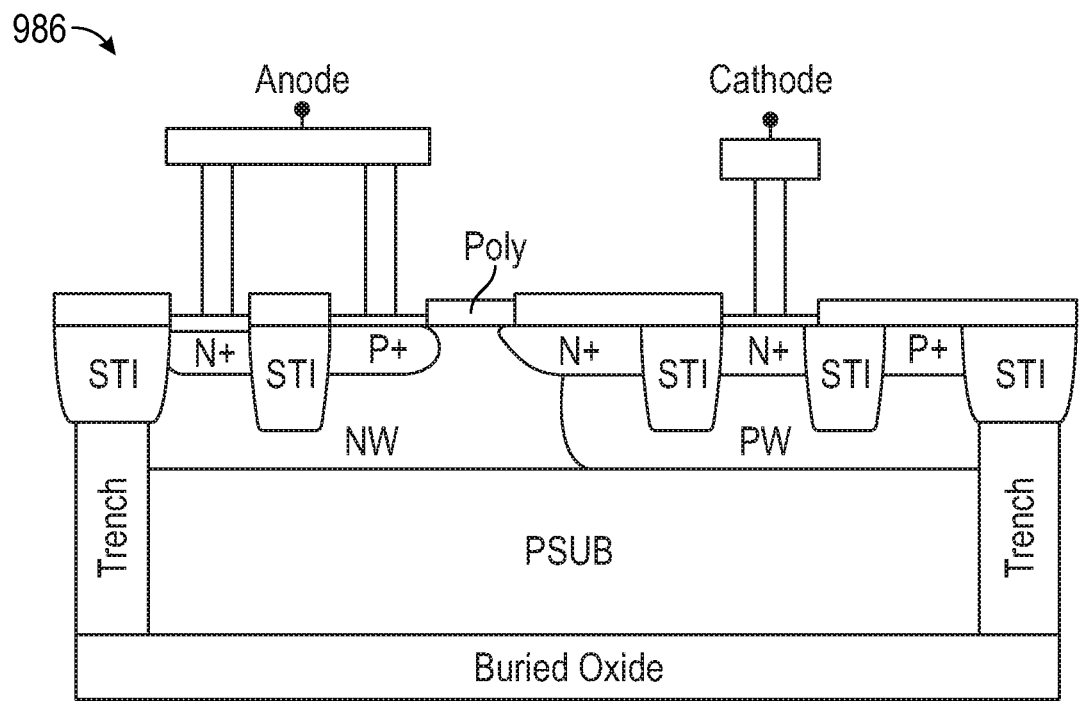
FIG. 11 illustrates generally a side view (e.g., a section view) of a solid-state silicon-controlled rectifier (SCR) device configuration, such as can be included as a portion of the solid-state clamp circuit shown illustratively in FIG. 9A.

FIG. 11 illustrates generally a side view (e.g., a section view) of a solid-state silicon-controlled rectifier (SCR) 986 device configuration, such as can be included as a portion of the solid-state clamp circuit shown illustratively in FIG. 9A. In the example of FIG. 11, the anode terminal can be electrically coupled to highly-doped n-type (N+) and p-type (P+) conductivity regions, such as formed in an n-type well (NW). The cathode terminal can be coupled to a highly-doped n-type (N+) conductivity region within a p-type well (PW). Silicon trench isolation structures can be provided as shown (e.g., "STI"), and deep trench structures can further provide isolation between adjacent devices. A silicon-on-insulator region having a p-type conductivity (PSUB) can be located below the anode and cathode structures, such as formed upon an oxide layer. A high-resistivity substrate can be located below the buried oxide, with the buried oxide providing reduced parasitic and improved isolation between devices as compared to a bulk-complementary-metal-oxide-semiconductor (CMOS) fabrication process. A floating polysilicon structure can improve the SCR 986 response to transients.

Figure 12A:
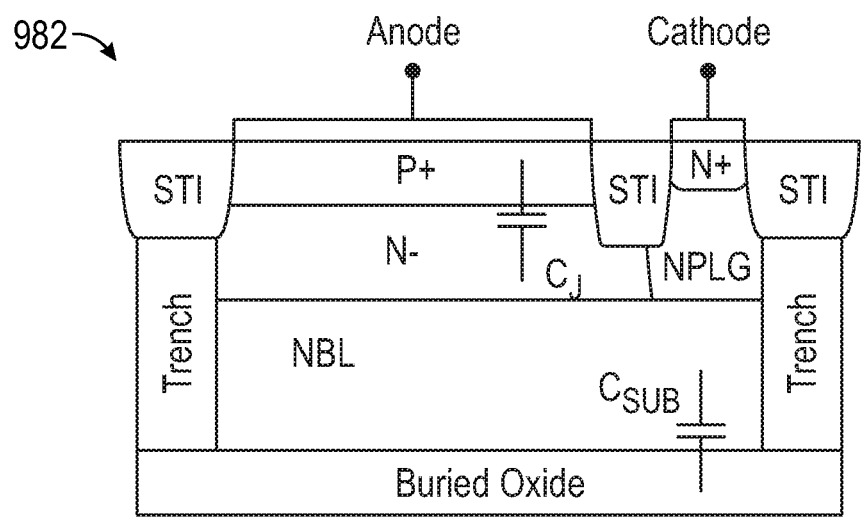
FIG. 12A illustrates generally a side view (e.g., a section view) of a first solid-state diode device architecture.
Figure 12B:
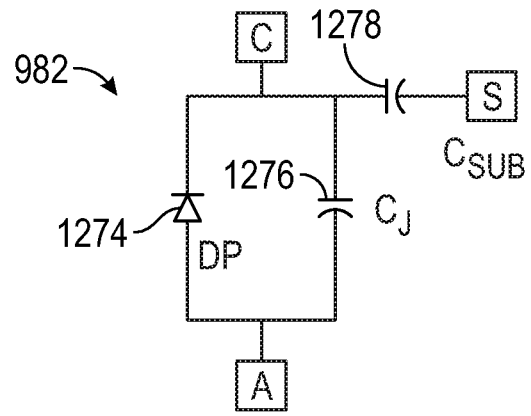
FIG. 12B illustrates generally a schematic representation of the first solid-state diode device architecture of FIG. 12A, including corresponding capacitances.

FIG. 12A illustrates generally a side view (e.g., a section view) of a first solid-state diode device 982 architecture and FIG. 12B illustrates generally a schematic representation of the first solid-state diode device architecture 982 of FIG. 12A, including corresponding capacitances. Referring to FIG. 12A, as in the example of FIG. 11, silicon trench isolation (STI) structures and deep trenches can laterally isolate the diode 982 from adjacent devices and the diode 982 can be formed using a silicon-on-insulator fabrication technique, such as facilitating co-integration with the SCR 986 of FIG. 11. An n-type buried layer (NBL) can be located above a buried oxide layer. The NBL-to-substrate capacitance, through the oxide layer, can be represented as $C_{SUB}$ as shown by the capacitor 1278 in FIG. 12B. Referring back to FIG. 12A, the junction can be formed in intrinsic silicon, such as below the anode structure, including a highly-doped p-type conductivity (P+) and a lightly-doped n-type conductivity (N−). The junction structure can also provide a parasitic capacitance, represented as $C_J$ and as shown by the capacitor 1276 in FIG. 12B. The cathode can be coupled to the junction using a highly-doped n-type region (N+) and an n-type plug region NPLG. Referring to FIG. 12B, the substrate capacitance is impressed between a substrate node "S" and the cathode "C," and the idealized diode 1274 thereby avoids having the anode "A" loaded by the substrate capacitance 1278 $C_{SUB}$ in the first diode device architecture.

Figure 13A:
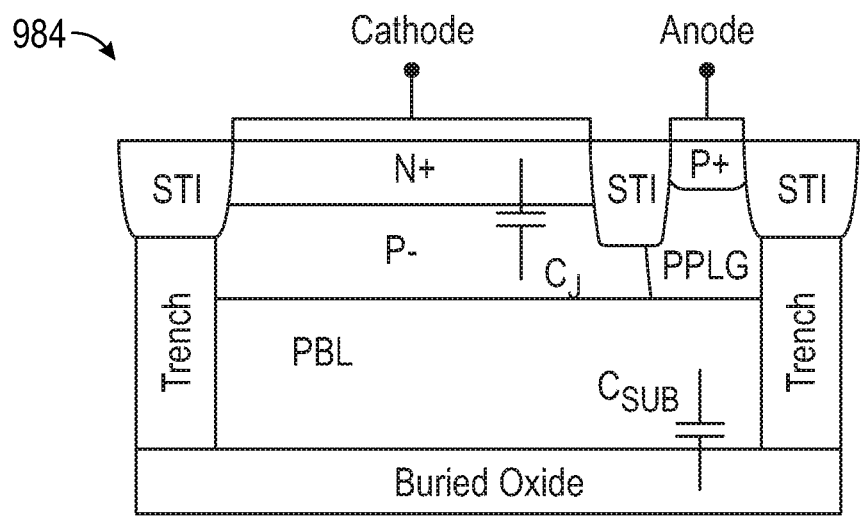
FIG. 13A illustrates generally a side view (e.g., a section view) of a second solid-state diode device architecture, such as providing a complementary structure as compared to the first solid-state diode device architecture shown in FIG. 12A.
Figure 13B:
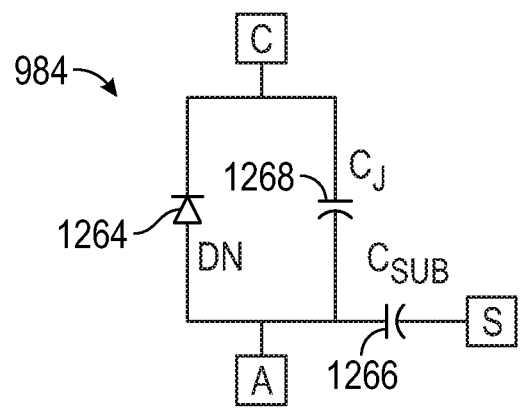
FIG. 13B illustrates generally a schematic representation of the second solid-state diode device architecture of FIG. 13A, including corresponding capacitances.

FIG. 13A illustrates generally a side view (e.g., a section view) of a second solid-state diode device architecture 984, such as providing a complementary structure as compared to the first solid-state diode device architecture 982 shown in FIG. 12A, and FIG. 13B illustrates generally a schematic representation of the second solid-state diode device architecture 984 of FIG. 13A, including corresponding capacitances. As in FIG. 12A, silicon trench isolation (STI) structures and corresponding deep trenches can be formed, such as upon a buried oxide layer, to provide lateral electrical isolation between devices. Other portions of second device architecture 984 can be similar to the first architecture 982, but having an opposite conductivity type. For example, the cathode terminal can be connected to a highly-doped n-type conductivity region (N+), and the junction can be formed by an interface between the N+ region and a lightly-doped p-type region (P−). The junction capacitance can again be represented by $C_J$, such as shown as a capacitor 1268 in FIG. 13B. Referring back to FIG. 13A, the anode can be connected to a highly-doped p-type conductivity region P+, located above a p-type plug. A buried p-type layer (PBL) be located below the anode and cathode regions, and the combination of the PBL layer, the oxide layer, and a high-resistivity substrate can define a substrate capacitance CSUB, such as can be represented by the capacitor 1266 in FIG. 13B. A cathode of the second diode device architecture 984 is isolated from loading by the substrate capacitance 1266. Referring back to FIG. 9A, in this manner, the diodes 982 and 984 can be arranged so that the input node IN is not loaded by the respective substrate capacitances.

Figure 14C:
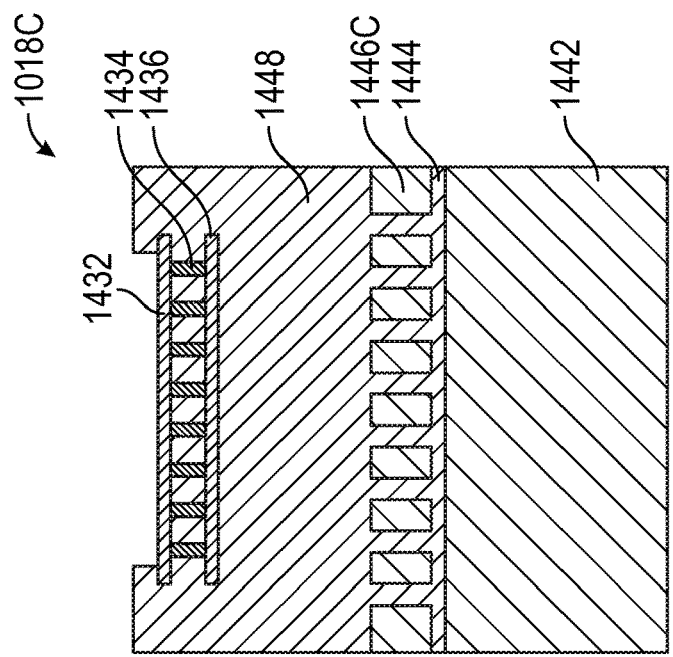
FIG. 14C illustrates generally a side view (e.g., a section view) of a second example of the bond pad architecture shown in FIG. 14A, including a slotted-trench portion.
Figure 14B:
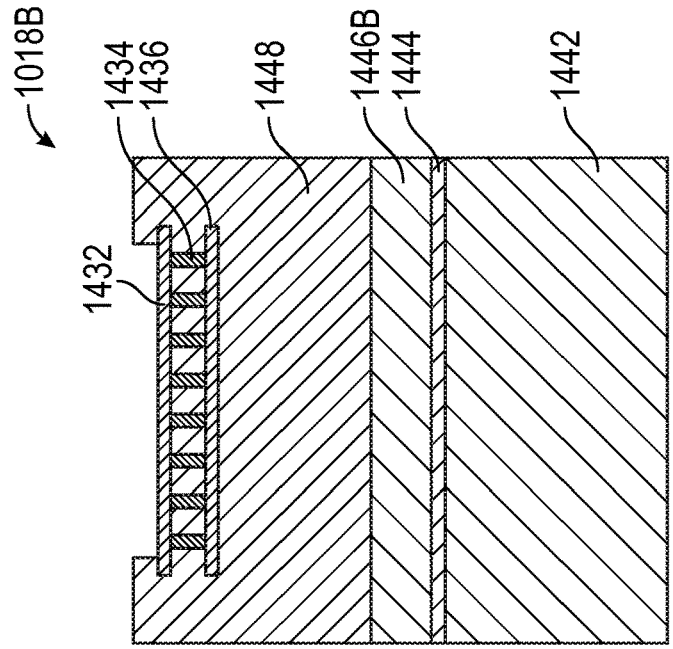
FIG. 14B illustrates generally a side view (e.g., a section view) of a first example of the bond pad architecture shown in FIG. 14A, such as omitting a slotted-trench portion.
Figure 14A:
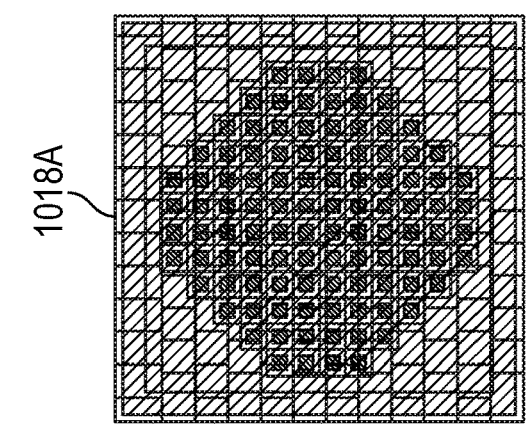
FIG. 14A illustrates generally a bond pad architecture, such as can be used to provide an electrical interconnection between a solid-state semiconductor die such as shown in FIG. 10 and other devices.

FIG. 14A illustrates generally a bond pad architecture 1018A, such as can be used to provide an electrical interconnection between a solid-state semiconductor die, such as the die 1008 such as shown in FIG. 10, and other devices. The bond pad architecture can include an array of via structures to provide a controlled impedance and low-loss structure to couple signals to specified metal layers, while maintaining isolation between such signals and a substrate.

Figure 15A:
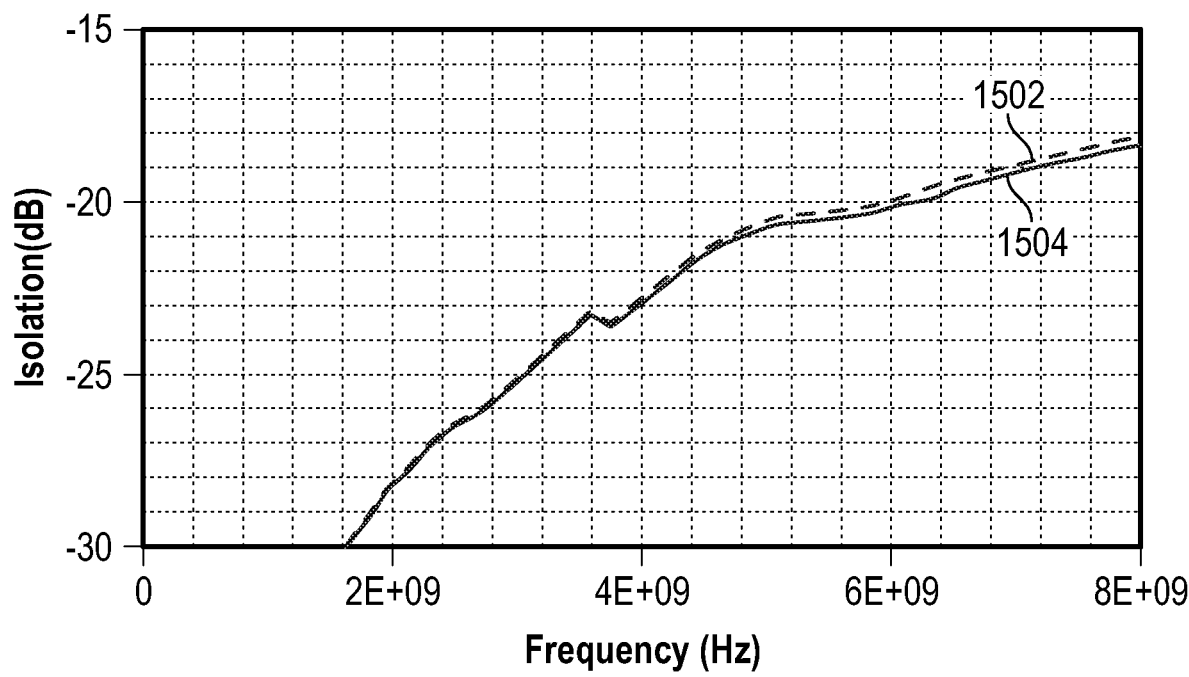
FIG. 15A shows illustrative examples of isolation performance as measured between the terminals of an open-circuited micro-electromechanical switch (MEMS) device in the presence of a coupled solid-state clamp circuit and in the absence of a coupled solid-state clamp circuit.

FIG. 14B illustrates generally a side view (e.g., a section view) of a first example 1018B of the bond pad architecture shown in FIG. 14A, such as omitting a slotted-trench portion, and FIG. 14C illustrates generally a side view (e.g., a section view) of a second example 1018C of the bond pad architecture shown in FIG. 14A, including a slotted-trench portion. In FIG. 14B and FIG. 14C, a high-resistivity substrate 1442, such as a silicon substrate having p-type conductivity can be used, for example, having a resistivity of 1000 Ohm-cm. A buried oxide layer 1444 can be included. An upper metal layer 1432, such as an aluminum metal layer can be formed, and via structures such as including a copper via 1434 can be used to couple the upper metal layer 1432 to another metal layer 1436. In FIG. 14B, an active silicon layer 1446B can extend along buried oxide layer 1444, and the active silicon layer 1446B can include a p-type conductivity, such as having a resistivity of 10 Ohm-cm. Another oxide region 1448 can be formed above the active silicon layer 1446B. By contrast, in FIG. 14C, the active silicon layer 1446C can include slots of oxide, in a "slotted trench" configuration. The slotted trench or isolated trench configuration can break a conductive circuit formed by the silicon layer under the bond pad structure, such as improving high-frequency (e.g., RF) electrical isolation of the bond pad from neighboring structures, FIG. 15A shows illustrative examples of isolation performance as measured between the terminals of an open-circuited micro-electromechanical switch (MEMS) device in the presence of a coupled solid-state clamp circuit (e.g., plot 1504) and in the absence of a coupled solid-state clamp circuit (e.g., plot 1502). As shown in FIG. 15A, the addition of a clamp circuit only minimally decreases isolation performance as compared to an un-protected MEMS device configuration.

Figure 15B:
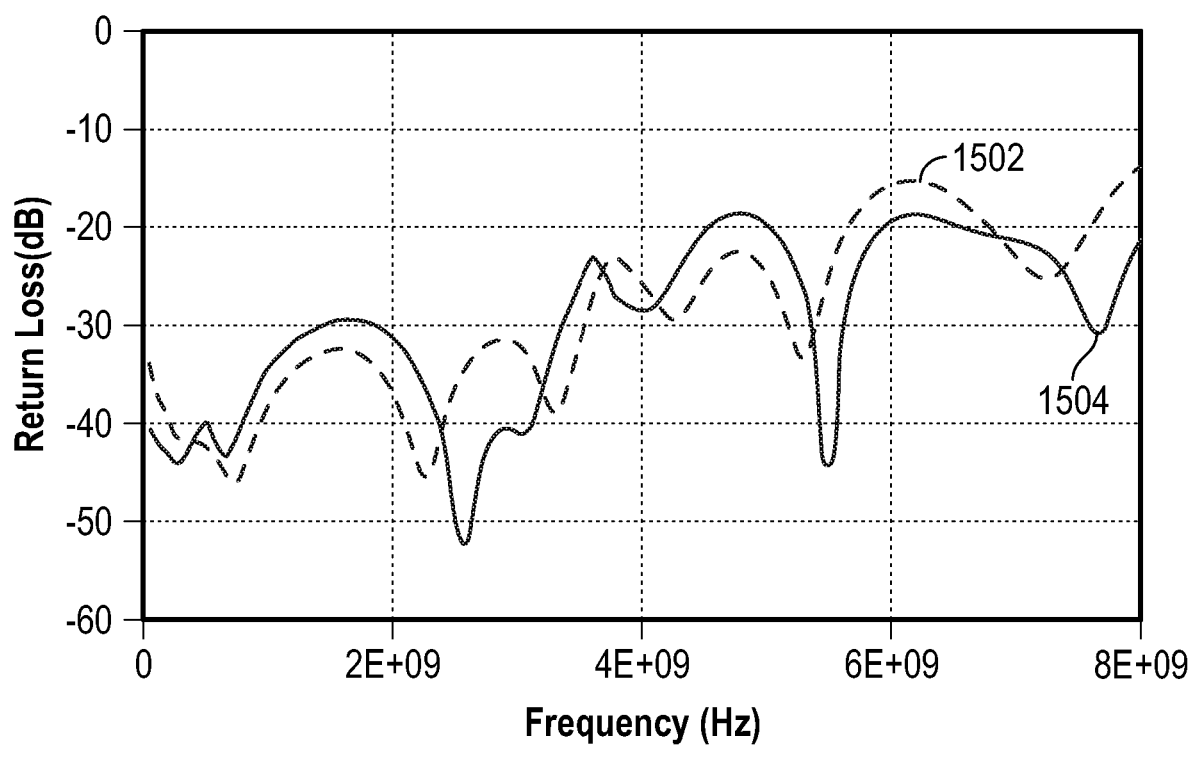
FIG. 15B shows illustrative examples of return loss performance as measured between an input terminal of an open-circuited micro-electromechanical switch (MEMS) and a reference node, in the presence of a coupled solid-state clamp circuit, and in the absence of a coupled solid-state clamp circuit.

FIG. 15B shows illustrative examples of return loss performance as measured between an input terminal of an open-circuited micro-electromechanical switch (MEMS) and a reference node, in the presence of a coupled solid-state clamp circuit plot 1504), and in the absence of a coupled solid-state clamp circuit (e.g., plot 1502). As shown in FIG. 15B, return loss performance is slightly degraded in certain frequency ranges (as indicated by a higher, less-negative value), but in some frequency ranges, return loss performance is actually improved in the presence of the clamp circuit. Across the entire range of frequencies shown in FIG. 15B, the peak return loss performance in the presence of the solid-state clamp circuit (e.g., plot 1504) is still better than the peak value in the bare-MEMS device case (e.g., plot 1502).

Figure 15C:
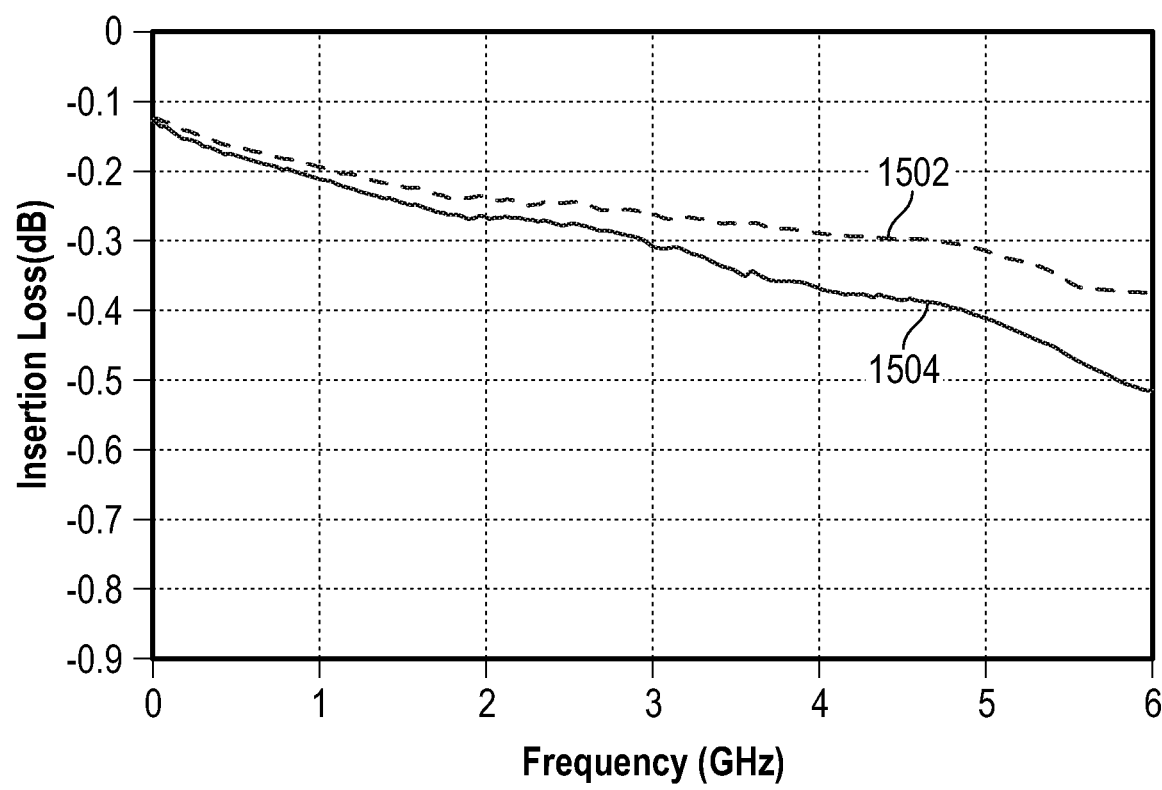
FIG. 15C shows illustrative examples of insertion loss performance as measured between the terminals of a closed micro-electromechanical switch (MEMS) in an actuated state, in the presence of a coupled solid-state clamp circuit, and in the absence of a coupled solid-state clamp circuit.

FIG. 15C shows illustrative examples of insertion loss performance as measured between the terminals of a closed micro-electromechanical switch (MEMS) in an actuated state, in the presence of a coupled solid-state clamp circuit (e.g., plot 1502), and in the absence of a coupled solid-state clamp circuit (e.g., plot 1504). As expected, insertion loss performance in the plot 1504 is degraded as compared to a bare-MEMS device example in plot 1502, but both insertion loss characteristics show a loss of less than 1 decibel (1 dB) across a range from zero to 6 gigahertz (GHz).

VARIOUS NOTES & EXAMPLES

Each of the non-limiting examples described herein can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.7 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic circuit having a micro-electromechanical switch device and a solid-state clamp circuit, the electronic circuit comprising:
   an integrated circuit device package, comprising:
   a first substrate;
   an integrated micro-electromechanical switch device located upon or within the first substrate;
   a hermetic enclosure defining a hermetically isolated region to isolate the integrated micro-electromechanical switch device from a surrounding environment;
   a solid-state clamp circuit electrically coupled to the micro-electromechanical switch and configured to suppress or inhibit damage to the micro-electromechanical switch due to a transient overvoltage condition, the solid-state clamp circuit comprising complementary branches of a series arrangement of first and second integrated diode devices where the first and second integrated diode devices in a same branch have complementary capacitance-to-voltage relationships, the first and second integrated diode devices respectively comprising laterally-separated anode and cathode regions arranged to provide protection for positive-going and negative-going voltage swings with respect to a reference node; and
   a control circuit electrically coupled to the integrated micro-electromechanical switch, the control circuit configured to receive a logic-level signal and to provide a control signal to electrostatically actuate the micro-electromechanical switch in response to the received logic-level signal.

2. The electronic circuit of claim 1, wherein the first and second integrated diode devices are arranged to provide a linear or approximately linear overall capacitance-to-voltage relationship for the clamp circuit.

3. The electronic circuit of claim 1, wherein the first integrated diode devices comprise a first type of diode defined by a first arrangement of regions of positive and negative conductivity types within a semiconductor device; and
   wherein the second integrated diode devices comprise a second type of diode defined by a second arrangement of positive and negative conductivity types within the semiconductor device, the second arrangement including conductive regions having a complementary conductivity type as compared to corresponding regions defining the first type of diode.

4. The electronic circuit of claim 2, wherein the first and second integrated diode devices are coupled to silicon-controlled rectifier (SCR) device structures integrated with the first and second integrated diode devices on a commonly-shared integrated circuit substrate.

5. The electronic circuit of claim 1, wherein the solid-state clamp circuit is monolithically integrated using a silicon-on-insulator substrate configuration.

6. The electronic circuit of claim 1, wherein the solid-state clamp circuit is heterogeneously integrated using a second substrate.

7. The electronic circuit of claim 6, wherein the second substrate includes a metallization layer defining a reference node; and
   wherein the reference node is conductively isolated from a conductive region defined at least in part by an electrically-insulating material included as a portion of the hermetic enclosure.

8. The electronic circuit of claim 6, wherein the solid-state clamp circuit is stacked upon at least a portion of the hermetic enclosure.

9. The electronic circuit of claim 6, wherein the second substrate comprises a portion of the hermetic enclosure.

10. The electronic circuit of claim 1, wherein the solid-state clamp circuit is co-integrated upon or within the same substrate as the microelectronic switch device.

11. The electronic circuit of claim 10, wherein at least a portion of the solid-state clamp circuit is located within the substrate directly above or directly below the micro-electromechanical switch device.

12. The electronic circuit of claim 10, wherein at least a portion of the solid-state clamp circuit is located in a region laterally adjacent to the micro-electromechanical switch device.

13. The electronic circuit of claim 1, wherein the solid-state clamp circuit and the micro-electromechanical switch device are placed upon a laminate substrate, the laminate substrate including a material different from the substrate upon which or in which the micro-electromechanical switch is fabricated.

14. The electronic circuit of claim 13, wherein the solid-state clamp circuit comprises discrete solid-state devices placed upon the laminate.

15. The electronic circuit of claim 14, wherein the discrete solid-state devices comprise one or more semiconductor dice mounted upon the laminate.

16. The electronic circuit of claim 1, wherein the control circuit and the clamp circuit are configured to suppress damage to the micro-electromechanical switch during hot-switching operations, where the micro-electromechanical switch is carrying a current.

17. The electronic circuit of claim 1, wherein the control circuit and the clamp circuit are configured to suppress damage to the micro-electromechanical switch during an electrostatic discharge (ESD) transient event.

18. The electronic circuit of claim 1, comprising multiple micro-electromechanical switches and clamp circuits.

19. The electronic circuit of claim 18, wherein the multiple micro-electromechanical switches are arranged to provide switching for automated test equipment.

20. The electronic circuit of claim 18, wherein the multiple micro-electromechanical switches are coupled to one or more other circuits to provide a portion of an electronic communication system.

21. The electronic circuit of claim 20, wherein the electronic communication system comprises a wireless or mobile device.

22. The electronic circuit of claim 18, wherein the multiple micro-electromechanical switches are arranged to provide a portion of a measurement instrument.

23. The electronic circuit of claim 1, wherein the micro-electromechanical switch comprises a first conductive terminal, a second conductive terminal and a control terminal, the micro-electromechanical switch configured to provide a conductive state or an open-circuit state between the first and second terminals in response to the control terminal.

24. The electronic circuit of claim 23, wherein the impedance presented by the micro-electromechanical switch in the conductive state provides conduction of signals between the terminals while meeting a specified insertion loss and a specified return loss for operation in a frequency range of the signals selected from a range from about 100 megahertz (MHz) to about 50 gigahertz (GHz).

25. The electronic circuit of claim 23, wherein the impedance presented by the micro-electromechanical switch in the conductive state provides conduction of signals between the terminals while meeting a specified insertion loss and a specified return loss for operation up to a frequency of about 6 gigahertz (GHz).

26. The electronic circuit of claim 1, wherein adjacent integrated diode devices are electrically isolated from each other by trench regions in the solid-state clamp circuit.

27. An electronic circuit having a micro-electromechanical switch device and a solid-state clamp circuit, the electronic circuit comprising:
   an integrated circuit device package, comprising:
   a first substrate;
   an integrated micro-electromechanical switch device located upon or within the first substrate;
   a hermetic enclosure defining a hermetically isolated region to isolate the integrated micro-electromechanical switch device from a surrounding environment; and
   a solid-state clamp circuit electrically coupled to the micro-electromechanical switch and configured to suppress or inhibit damage to the micro-electromechanical switch due to a transient overvoltage condition, the solid-state clamp circuit comprising complementary branches of a series arrangement of first and second integrated diode devices where the first and second integrated diode devices in a same branch have complementary capacitance-to-voltage relationships,
   wherein the first and second integrated diode devices are coupled to silicon-controlled rectifier (SCR) device structures integrated with the first and second integrated diode devices on a commonly-shared integrated circuit substrate.

28. The electronic circuit of claim 27, wherein the first and second integrated diode devices respectively comprise laterally-separated anode and cathode regions.

29. The electronic circuit of claim 27, wherein the first integrated diode devices comprise a first type of diode defined by a first arrangement of regions of positive and negative conductivity types within a semiconductor device, and
   wherein the second integrated diode devices comprise a second type of diode defined by a second arrangement of positive and negative conductivity types within the semiconductor device, the second arrangement including conductive regions having a complementary conductivity type as compared to corresponding regions defining the first type of diode.

30. The electronic circuit of claim 27, wherein the micro-electromechanical switch device comprises an active-opening architecture, further comprising a control circuit configured to provide a de-actuation signal to electrostatically open the micro-electromechanical switch device.

31. The electronic circuit of claim 27, wherein adjacent integrated diode devices are electrically isolated from each other by trench regions in the solid-state clamp circuit.

32. A method for protecting a micro-electromechanical switch device, the method comprising:
   coupling a signal to a hermetically-enclosed integrated circuit device package housing a micro-electromechanical switch device;
   suppressing or inhibiting damage to the micro-electromechanical switch device from the signal, using a solid-state clamp circuit electrically coupled to the micro-electromechanical switch device during a transient overvoltage condition, the solid-state clamp included as a portion of the integrated circuit device package; and
   compensating for a non-linear capacitance-to-voltage relationship of a diode included as a portion of the solid-state clamp circuit using a series arrangement of complementary branches of first and second integrated diode devices where the first and second integrated diode devices in a same branch have complementary capacitance-to-voltage relationships, the first and second integrated diode devices respectively comprising laterally-separated anode and cathode regions;

wherein a state of the micro-electromechanical switch device is controlled using a control circuit configured to receive a logic-level signal and to provide a control signal to electrostatically actuate the micro-electromechanical switch device in response to the received logic-level signal, the control circuit included as a portion of the integrated circuit device package.

33. The method of claim 32, comprising controlling the clamp circuit using silicon-controlled rectifier (SCR) device structures integrated with the first and second integrated diode devices on a commonly-shared integrated circuit substrate, the SCR device structures electrically coupled to the first and second integrated diode devices.

34. The method of claim 32, wherein the solid-state clamp circuit is monolithically integrated using a silicon-on-insulator substrate configuration.

35. The method of claim 34, wherein the silicon-on-insulator substrate configuration comprises an oxide layer located on the substrate, and a silicon layer located on the oxide layer; and wherein solid-state clamp circuit is formed upon or within a silicon layer and one or more conductive regions interconnecting the solid-state clamp circuit with one or more terminals of the micro-electromechanical switch device.

36. The method of claim 32, comprising providing a conductive state between a first conductive terminal and a second conductive terminal of the integrated circuit device package using the micro-electromechanical switch device in response to a received logic-level signal, the logic-level signal processed by the control circuit included as a portion of the integrated circuit device package to provide an actuation signal to the micro-electromechanical switch device.

37. The electronic circuit of claim 27, wherein the micro-electromechanical switch device includes a cantilevered arm that is electrostatically attracted to another portion of the micro-electromechanical switch in response to the actuation signal to actuate the switch establishing conduction between the first and second conductive terminals.

38. The method of claim 36, comprising providing a non-conductive state isolating the first and second conductive terminals of the integrated circuit device package in response to the received logic-level signal, the logic-level signal processed by the control circuit.

39. The method of claim 38, wherein the control circuit is configured to inhibit the actuation signal to provide the non-conductive state.

40. The method of claim 38, wherein the control circuit is configured to provide a de-actuation signal to electrostatically open the micro-electromechanical switch device using an active-opening micro-electromechanical switch device architecture.

41. The method of claim 34, comprising presenting an impedance using the micro-electromechanical switch device to provide conduction of signals between terminals of the integrated circuit device package while meeting a specified insertion loss and a specified return loss for operation in a frequency range of the signals selected from a range from about 100 megahertz (MHz) to about 50 gigahertz (GHz).

42. The method of claim 41, wherein the impedance presented by the micro-electromechanical switch in the conductive state providing conduction of signals between the terminals includes meeting a specified insertion loss and a specified return loss for operation up to a frequency of about 6 gigahertz (GHz).

43. The method of claim 32, wherein the suppressing or inhibiting the damage to the micro-electromechanical switch device from the signal includes suppressing or inhibiting damage during a hot-switching operation where the micro-electromechanical switch state is changed while the switch is carrying a current.

44. The method of claim 32, wherein the suppressing or inhibiting the damage to the micro-electromechanical switch device from the signal includes suppressing or inhibiting damage from an electrostatic discharge (ESD) transient event.

* * * * *